(12) United States Patent
Okumura

(10) Patent No.: US 11,164,859 B2
(45) Date of Patent: Nov. 2, 2021

(54) SEMICONDUCTOR DEVICE

(71) Applicant: FUJI ELECTRIC CO., LTD., Kawasaki (JP)

(72) Inventor: Keiji Okumura, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 79 days.

(21) Appl. No.: 16/773,190

(22) Filed: Jan. 27, 2020

(65) Prior Publication Data

US 2020/0294989 A1    Sep. 17, 2020

(30) Foreign Application Priority Data

Mar. 14, 2019 (JP) .............................. JP2019-047712

(51) Int. Cl.
*H01L 27/02* (2006.01)
*H01L 29/423* (2006.01)

(52) U.S. Cl.
CPC ...... *H01L 27/0248* (2013.01); *H01L 29/4236* (2013.01); *H01L 29/42372* (2013.01)

(58) Field of Classification Search
CPC ............. H01L 27/0248; H01L 27/0288; H01L 29/4236; H01L 29/42372; H01L 29/1095; H01L 29/1608; H01L 29/4238; H01L 29/7803; H01L 29/0623; H01L 29/0878; H01L 29/7813; H01L 29/7397; H01L 29/7811; H01L 2224/0603; H01L 23/4824
See application file for complete search history.

(56) References Cited

U.S. PATENT DOCUMENTS

| 2014/0312416 | A1* | 10/2014 | Miyakoshi | .......... | H01L 29/4916 |
| | | | | | 257/337 |
| 2016/0379992 | A1 | 12/2016 | Nagao et al. | | |
| 2017/0110545 | A1* | 4/2017 | Nagao | ..................... | H01L 29/47 |
| 2017/0194316 | A1* | 7/2017 | Kang | ................... | H01L 29/0696 |
| 2017/0338336 | A1 | 11/2017 | Nasu | | |
| 2020/0243505 | A1* | 7/2020 | Weyers | ............... | H01L 23/5226 |

FOREIGN PATENT DOCUMENTS

| JP | 2003-197914 A | 7/2003 |
| JP | 2017-212432 A | 11/2017 |
| WO | 2015/080162 A1 | 6/2015 |

* cited by examiner

*Primary Examiner* — Sitaramarao S Yechuri
(74) *Attorney, Agent, or Firm* — Rabin & Berdo, P.C.

(57) ABSTRACT

A gate pad is includes a first portion disposed in a gate pad region and a second portion disposed in a gate resistance region and connected to the first portion, the gate pad has a planar shape in which the second portion protrudes from the first portion. A gate polysilicon layer disposed on a front surface of a semiconductor substrate via a gate insulating film, between the semiconductor substrate and an interlayer insulating film, has a surface area at least equal to that of the gate pad and opposes an entire surface of the gate pad in a depth direction. ESD capability of a first region where the gate pad is provided is greater than ESD capability of a second region where a gate resistance is provided and is greater than ESD capability of a third region where a MOS structure of an active region is provided.

23 Claims, 12 Drawing Sheets

SEMICONDUCTOR DEVICE

CROSS REFERENCE TO RELATED APPLICATIONS

This application is based upon and claims the benefit of priority of the prior Japanese Patent Application No. 2019-047712, filed on Mar. 14, 2019, the entire contents of which are incorporated herein by reference.

BACKGROUND OF THE INVENTION

1. Field of the Invention

Embodiments of the invention relate to a semiconductor device.

2. Description of the Related Art

Conventionally, when plural metal oxide semiconductor field effect transistor (MOSFET) chips are used connected in parallel and the MOSFETs include insulated gates formed by a three-layered structure including a metal, an oxide film, and a semiconductor material, connection of gate resistance in series between a gate pad and gate electrodes is known to stabilize switching operation of the MOSFETs (for example, refer to International Publication No. WO 2015/080162, Japanese Laid-Open Patent Publication No. 2003-197914, Japanese Laid-Open Patent Publication No. 2017-212432).

A structure near the gate pad of a conventional semiconductor device will be described. FIG. 10 is a plan view of a layout near the gate pad of the conventional semiconductor device, as viewed from a front surface of a semiconductor substrate. In FIG. 10, a layout of MOS gates disposed in cell regions 105 of an active region is not depicted. FIG. 11 is a cross-sectional view of the structure along cutting line AA-AA' in FIG. 10. FIGS. 10 and 11 are FIGS. 2 and 3b of International Publication No. WO 2015/080162, respectively.

As depicted in FIGS. 10 and 11, in a semiconductor device 160, in the active region, on a front surface of a semiconductor substrate 110, a source pad 101 and a gate pad 102 are disposed via an interlayer insulating film 111. The source pad 101 is disposed in each of the cell regions 105 partitioned by a gate runner 104 and substantially covers the entire active region. The gate pad 102 is provided near a border between the active region and an edge termination region that surrounds a periphery of the active region.

Further, the gate pad 102 is electrically connected to gate electrodes 112 via built-in resistors 103 and the gate runner 104. The built-in resistors 103 are provided on the front surface of the semiconductor substrate 110 via an oxide film 113 and are disposed between the semiconductor substrate 110 and the interlayer insulating film 111. The built-in resistors 103 oppose the gate pad 102 and the gate runner 104, across the interlayer insulating film 111 in a depth direction Z.

The gate pad 102 has a substantially rectangular planar shape and the built-in resistors 103 respectively oppose vicinities of four vertices of the gate pad 102 while avoiding a central portion of the gate pad 102 where wiring is bonded. The built-in resistors 103 are formed using polysilicon (poly-Si). A size of each of the built-in resistors 103 is 200 square-μm at most and therefore, reduction of a mathematical area of the cell region 105 due to disposal of the built-in resistors 103 is prevented.

The built-in resistors 103 are connected in series between the gate electrodes 112 and the gate pad 102. A sum of resistance values of the gate electrodes 112 and resistance values of the built-in resistors 103 is a gate resistance. In International Publication No. WO 2015/080162, in the gate resistance that is the sum of the resistance values of the gate electrodes 112 and the resistance values of the built-in resistors 103, the resistance values of the built-in resistors 103 may be set to be greater than variation of the resistance values of the gate electrodes 112 and thus, more dominate.

In the gate resistance, by making the resistance values of the built-in resistors 103 more dominate, when the plural MOSFET chips having variation among the resistance values of the gate electrodes 112 are used connected in parallel, the flow of current to MOSFET chips in which the resistance values of the gate electrodes 112 are relatively low among the plural MOSFET chips is controlled, whereby an occurrence of noise during MOSFET switching is suppressed.

Reference character 111a represents contact holes where a contact between the source pad 101 and an $n^+$-type source region 114 and a $p^+$-type contact region 115 is formed. Reference character 111b represents contact holes where a contact between the gate pad 102 and the built-in resistors 103 is formed. Reference character 111c represents contact holes where a contact between the gate runner 104 and the built-in resistors 103 is formed. Reference character 116 is a passivation film.

FIG. 12 is a plan view of an example of another layout near the gate pad of the conventional semiconductor device, as viewed from the front surface of the semiconductor substrate. FIG. 13 is a cross-sectional view of the structure along cutting line BB-BB' in FIG. 12. FIGS. 12 and 13 are FIGS. 1(a) and 1(b) of Japanese Laid-Open Patent Publication No. 2003-197914, respectively. As depicted in FIGS. 12 and 13, in the semiconductor device 160 of Japanese Laid-Open Patent Publication No. 2003-197914 as well, the built-in resistors 103 are disposed so as to oppose the gate pad 102 in the depth direction Z and the mathematical area of the active region is prevented from decreasing.

Further, an outer peripheral edge of the built-in resistors 103 is extended further outward (toward side surfaces of the semiconductor substrate 110) in one direction parallel to the front surface of the semiconductor substrate 110 than is an outer peripheral edge of the gate pad 102. As a result, an interval L101 between each of the contact holes 111b where contact between the built-in resistors 103 and the gate pad 102 is formed and each of the contact holes 111c where contact between the built-in resistors 103 and the gate runner 104 is formed is changed and the resistance value between the gate runner 104 and the gate pad 102 is adjusted.

In Japanese Laid-Open Patent Publication No. 2017-212432, in a semiconductor device in which a transistor and a low-voltage diode are implemented on a single semiconductor substrate, in a layer beneath a source pad, a constant voltage diode formed using polysilicon is disposed along a periphery of the source pad. Reverse current generated when large voltage such as static electricity or surge voltage is applied flows on a ground side via the constant voltage diode and therefore, electrostatic discharge (ESD) capability is enhanced.

SUMMARY OF THE INVENTION

A semiconductor device has an active region in which a Metal-Oxide-Semiconductor (MOS) structure including a MOS transistor is configured, and in which current flows during an ON state of the MOS transistor. The semiconductor device includes a semiconductor substrate having a first main surface and a second main surface opposite to the first main surface, a gate electrode provided on the semiconductor substrate via a gate insulating film, the gate electrode and the gate insulating film constituting a part of the MOS transistor, an interlayer insulating film provided on the first main surface of the semiconductor substrate, an oxide film provided on the first main surface of the semiconductor substrate, a gate pad having a first surface area in a plan view, and being provided on the first main surface of the semiconductor substrate via the interlayer insulating film, the interlayer insulating film being provided between the semiconductor substrate and the gate pad, and a gate polysilicon layer including a gate resistance, and having a second surface area in the plan view, the gate polysilicon pad facing the gate pad in a depth direction, via the interlayer insulating film, and being electrically insulated from the semiconductor substrate by the oxide film, the oxide film being disposed between the semiconductor substrate and the gate polysilicon layer. The gate pad is formed by a first pad portion having a first part of the first surface area, where wiring is bonded and a second pad portion having a second part of the first surface area, connected to the gate resistance, and being continuous with the first pad portion, the gate polysilicon layer is formed by a first polysilicon portion having a first part of the second surface area equal to or greater than the first part of the first surface area, and facing the first pad portion in the depth direction via the interlayer insulating film, the first polysilicon portion being disposed within the first pad portion in the plan view, and a second polysilicon portion having a second part of the second surface area equal to or greater than the second part of the first surface area, and facing the second pad portion in the depth direction via the interlayer insulating film, the second polysilicon portion being disposed within the second pad portion in the plan view, the second polysilicon portion forming the gate resistance and being electrically connected between the second pad portion and the gate electrode, and being continuous with the first polysilicon portion. An ESD capability of a first region in which the gate pad is provided is greater than an ESD capability of a second region in which the gate resistance is provided, and an ESD capability of a third region in which the MOS structure is provided, the third region being disposed within the active region.

In the embodiment, the ESD capability of the third region in which the MOS structure is provided is greater than the ESD capability of the second region in which the gate resistance is provided.

In the embodiment, a capacitance of the first region in which the gate pad is provided is greater than a capacitance of the second region in which the gate resistance is provided and a capacitance of the third region in which the MOS structure is provided.

In the embodiment, a capacitance of the third region in which the MOS structure is provided is greater than a capacitance of the second region in which the gate resistance is provided.

In the embodiment, the interlayer insulating film sandwiched between the gate pad and the gate polysilicon layer, or the oxide film sandwiched between the gate polysilicon layer and the semiconductor substrate has a thickness greater than a thickness of the gate insulating film of the third region in which the MOS structure is provided.

In the embodiment, the oxide film sandwiched between the gate polysilicon layer and the semiconductor substrate in the second region in which the gate resistance is provided having a thickness greater than a thickness of the gate insulating film of the MOS transistor.

In the embodiment, the oxide film sandwiched between the gate polysilicon layer and the semiconductor substrate in the second region in which the gate resistance is provided has a permittivity lower than a permittivity of the gate insulating film of the MOS transistor.

In the embodiment, the oxide film sandwiched between the gate polysilicon layer and the semiconductor substrate in the second region in which the gate resistance is provided has a permittivity lower than a permittivity of the gate insulating film of the MOS transistor.

In the embodiment, the oxide film sandwiched between the gate polysilicon layer and the semiconductor substrate and being disposed in the first region and the gate insulating film of the MOS transistor are made of a common layer. The semiconductor device further includes a thin deposited film of oxide, provided between the oxide film and the semiconductor substrate.

In the embodiment, the interlayer insulating film sandwiched between the gate pad and the gate polysilicon layer is an oxide film containing phosphorus, and the gate insulating film is an oxide film containing nitrogen.

In the embodiment, the third region has a third surface area in the plan view, and the second part of the second surface area is smaller than the first surface area or the third surface area.

In the embodiment, the MOS structure of the active region includes a trench gate structure formed by: in a first conductivity type surface layer of the first main surface of the semiconductor substrate, a first semiconductor region of a second conductivity type; a second semiconductor region of the first conductivity type, selectively provided in the first semiconductor region; a third semiconductor region of the first conductivity type, the third semiconductor region being a portion of the semiconductor substrate excluding the first semiconductor region; a trench penetrating the second semiconductor region and the first semiconductor region, and reaching the third semiconductor region; and the gate electrode provided in the trench via the gate insulating film, a first electrode electrically connected to the first semiconductor region and the second semiconductor region, and a second electrode electrically connected to the second main surface of the semiconductor substrate, and the gate polysilicon layer is electrically connected to the gate electrode or the first electrode.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
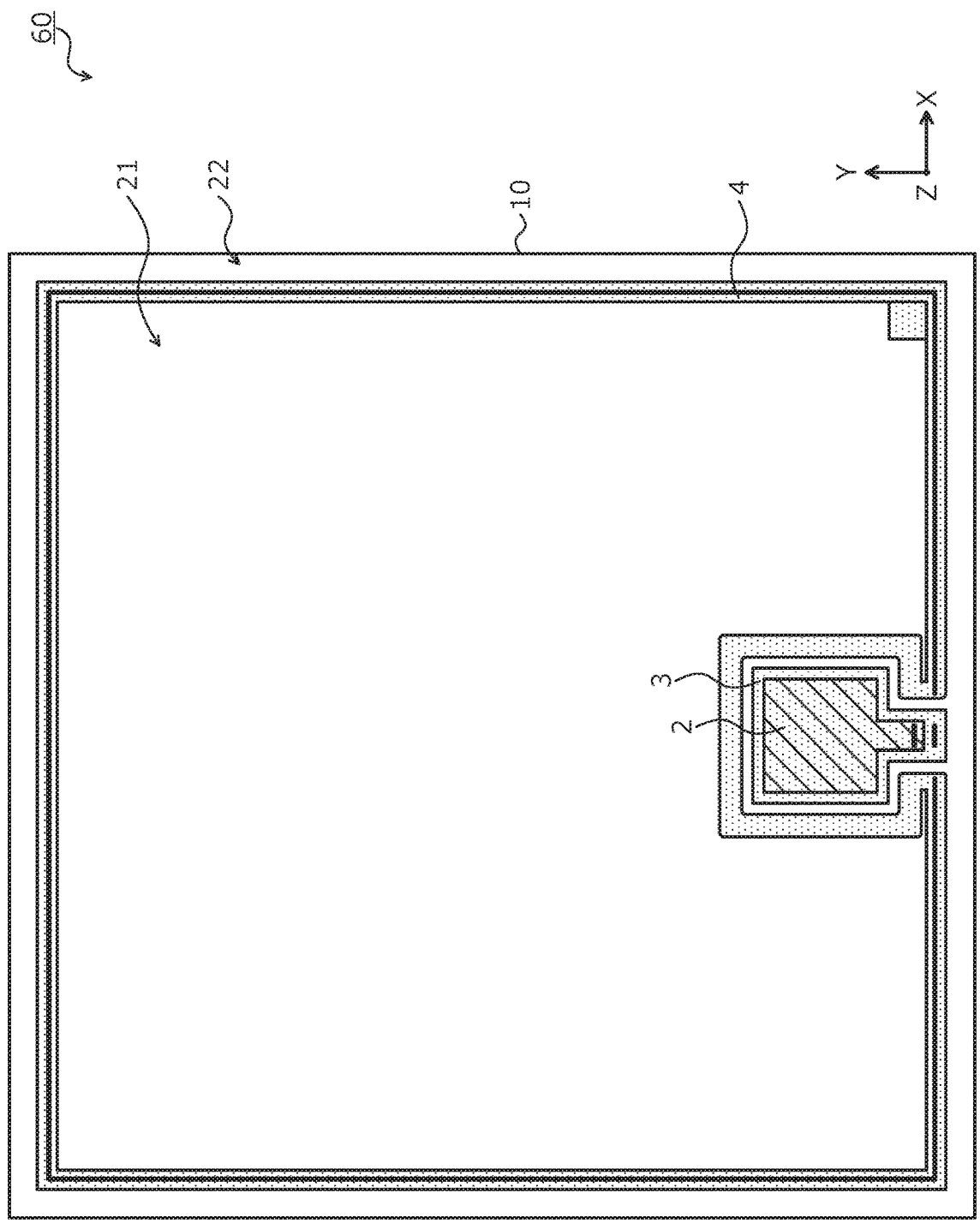
FIG. 1 is a plan view of a layout of a semiconductor device according to a first embodiment, as viewed from a front surface of a semiconductor substrate.

First, problems associated with the conventional techniques will be discussed. In International Publication No. WO 2015/080162 and Japanese Laid-Open Patent Publication No. 2003-197914, surface area of the built-in resistors 103 is small and therefore, when a large amount of charge due to ESD and the like is injected in the gate pad 102, high voltage is applied to the oxide film 113 beneath the built-in resistors 103 and the oxide film 113 is easily destroyed. On the other hand, when the surface area of the built-in resistors 103 is large and the voltage applied to the oxide film 113 is distributed and unevenness occurs between the gate pad 102 and the front surface of the semiconductor substrate 110. Due to this unevenness, etching for patterning a metal film that forms the gate pad 102 or etching of an etching resist mask for patterning the metal film may be impossible and defects due to etching residue (metallic residue or resist residue) that could not be completely removed where the unevenness occurs may result, whereby yield may decrease.

Further, metal of the gate pad 102 and the semiconductor substrate 110 has to be insulated and therefore, an insulating film is provided beneath the gate pad 102. For example, between the gate pad 102 and the semiconductor substrate 110, the oxide film 113 and the interlayer insulating film 111 are provided. These insulating films may be thick to withstand ultrasonic power during assembly such as wire bonding or module stress. However, when the insulating films are thick, capacitance of regions beneath the gate pad 102 decreases and therefore, ESD capability decreases; and in a structure in which the built-in resistors 103 are not added, is a sum of the capacitance of regions beneath the gate pad 102 and that of a region in which MOS structures are provided in the active region of the semiconductor device, and thus, not problematic. However, in a structure in which the built-in resistors 103 are added, due to the capacitance of regions beneath the built-in resistors 103 and the capacitance of regions beneath the gate pad 102, the ESD capability may be determined and in this case, the ESD capability may decrease.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference characters and will not be repeatedly described.

Figure 2:
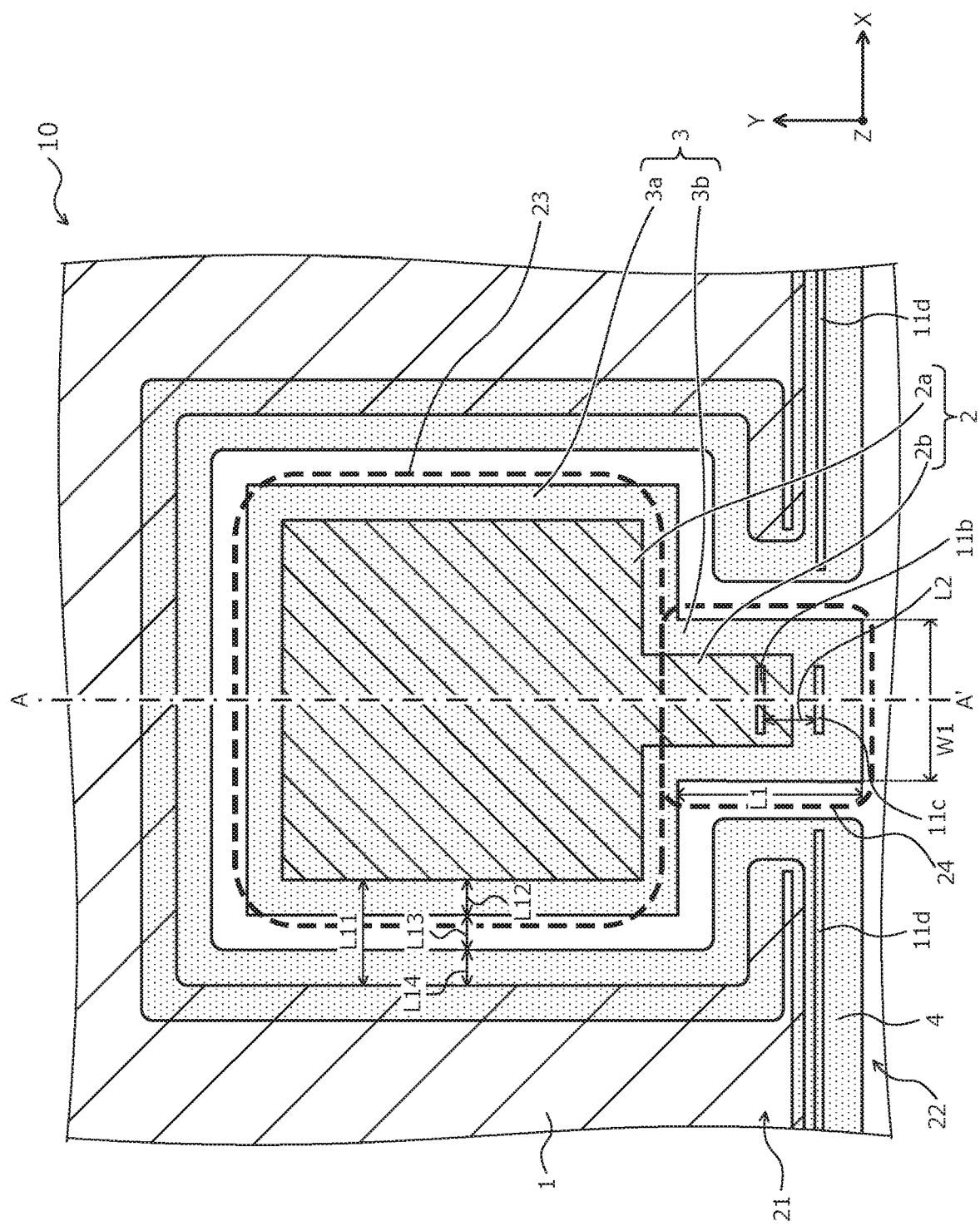
FIG. 2 is an enlarged plan view of a portion of FIG. 1.

A structure of a semiconductor device according to a first embodiment will be described. FIG. 1 is a plan view of a layout of a semiconductor device 60 according to the first embodiment, as viewed from a front surface of a semiconductor substrate (semiconductor chip). FIG. 2 is an enlarged plan view of a portion of FIG. 1. FIG. 2 depicts a vicinity of a gate pad 2 in FIG. 1. First, the layout of the semiconductor device 60 according to the first embodiment will be described as viewed from the front surface of the semiconductor substrate.

Figure 3:
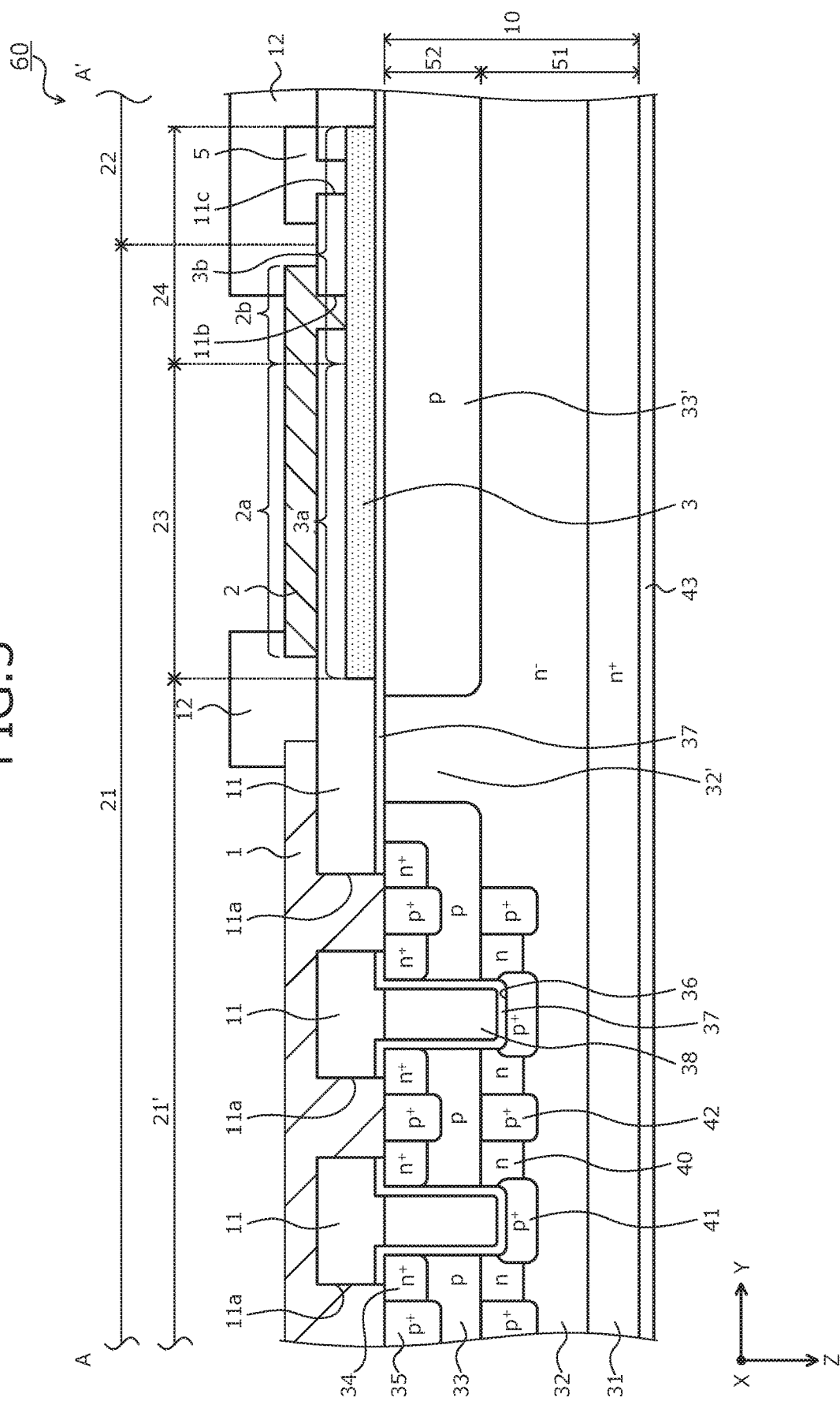
FIG. 3 is a cross-sectional view of a structure along cutting line A-A' in FIG. 2.

The semiconductor device 60 according to the first embodiment and depicted in FIGS. 1 and 2 is a MOSFET in which a source pad (first electrode) 1 (portion hatched with diagonal lines and indicated by reference character 1; not depicted in FIG. 1) and the gate pad 2 (portion hatched with diagonal lines and indicated by reference character 2) are provided on a front surface of a semiconductor substrate 10 in an active region 21, via an interlayer insulating film 11 (refer to FIG. 3). At a portion of the active region 21 opposing the source pad 1 in the depth direction Z, one or more non-depicted unit cells (structural units of an element) of the MOSFET are disposed.

The active region 21 is a region in which current flows when the MOSFET is in an ON state. A periphery of the active region 21 is surrounded by an edge termination region 22. The edge termination region 22 is a region between the active region 21 and side surfaces of the semiconductor substrate 10, and has a voltage withstanding structure for mitigating electric field of an $n^+$-type drift region (third semiconductor region) 32 (refer to FIG. 3) in a front surface side of the semiconductor substrate 10 and for sustaining breakdown voltage (withstand voltage). Breakdown voltage is a voltage limit at which destruction or errant operation of an element does not occur.

The source pad 1 is disposed separated from the gate pad 2 by a predetermined distance L11. The source pad 1 covers substantially an entire surface of the active region 21 excluding a portion where the gate pad 2 is disposed. In particular, the source pad 1, for example, is partially recessed so as to surround a periphery of the gate pad 2 and has a substantially rectangular planar shape with a mathematical area substantially equal to that of the active region 21. The source pad 1 is electrically connected to an $n^+$-type source region (second semiconductor region) 34 (refer to FIG. 3) and a $p^+$-type contact region 35 (refer to FIG. 3) via first contact holes 11a.

The outer peripheral edge of the source pad 1, along an entire perimeter, opposes in the depth direction Z across the interlayer insulating film 11, a gate runner 4 described hereinafter and formed by polysilicon (poly-Si). As a result, unevenness that occurs between the source pad 1 and the front surface of the semiconductor substrate 10 becomes smaller and therefore, metal residue due to patterning of a metal film containing, for example, aluminum (Al) and forming the source pad 1 decreases, whereby short circuit defects caused by metal residue become less likely to occur.

The gate pad 2, for example, is disposed near a border between the active region 21 and the edge termination region 22. The gate pad 2 is formed by a first portion (first pad portion) 2a disposed in a gate pad region (first region) 23 and a second portion (second pad portion) 2b disposed in a gate resistance region (second region) 24, the first portion 2a and the second portion 2b being continuous with each other. The gate pad 2 has a planar shape and has a first surface area in plan view. In the gate pad 2, a surface area (second part of the first surface area) of the second portion 2b is smaller than a surface area (first part of the first surface area) of the first portion 2a and the second portion 2b is disposed adjacently, further outwardly (toward a side surface of the semiconductor substrate 10) than is the first portion 2a.

In particular, for example, the first and the second portions 2a, 2b of the gate pad 2 may both have a substantially rectangular planar shape. In this case, each side of the second portion 2b of the gate pad 2 is shorter than a side of the first portion 2a of the gate pad 2. The gate pad 2 has a protruding planar shape in which one side of the second portion 2b is connected to a side of the first portion 2a nearest the border between the active region 21 and the edge termination region 22, and the second portion 2b protrudes outwardly from the one side of the first portion 2a.

The first and the second portions 2a, 2b of the gate pad 2, for example, are formed using a metal containing aluminum similarly to the source pad 1 and are positioned at a same level as the source pad 1. The first and the second portions 2a, 2b of the gate pad 2, for example, may be formed concurrently with the source pad 1. Gate electrodes 38 of all the unit cells of the MOSFET are electrically connected to the gate pad 2, via a gate polysilicon layer 3 (portion hatched with dots and indicated by reference character 3) described hereinafter and the gate runner 4 (portion hatched with dots and indicated by reference character 4).

The first portion 2a of the gate pad 2 is a portion where wiring for leading out electric potential of the gate electrodes 38 (refer to FIG. 3) of the MOSFET is bonded. The second portion 2b of the gate pad 2 is a connection portion for electrically connecting the first portion 2a of the gate pad 2 and a second portion 3b of the gate polysilicon layer 3 described hereinafter. The second portion 2b of the gate pad 2 is electrically connected to the second portion 3b of the gate polysilicon layer 3 via a second contact hole 11b.

The gate polysilicon layer 3 is provided on the front surface of the semiconductor substrate 10 via a gate insulating film 37 and is disposed between the semiconductor substrate 10 and the interlayer insulating film 11. Further, the gate polysilicon layer 3 has a surface area that is at least equal to a surface area of the gate pad 2 and opposes an entire surface of the gate pad 2, in the depth direction Z. The gate polysilicon layer 3 may have a planar shape similar to the planar shape of the gate pad 2. For example, the gate polysilicon layer 3, similarly to the gate pad 2, has a protruding planar shape having a second surface area, and is formed by first and second portions 3a, 3b described hereinafter.

In particular, the gate polysilicon layer 3 is formed by the first portion (first polysilicon portion) 3a disposed in the gate pad region 23 and the second portion (second polysilicon portion) 3b disposed in the gate resistance region 24, the first portion 3a and the second portion 3b being continuous with each other. In the gate polysilicon layer 3, a surface area (second part of the second surface area) of the second portion 3b is smaller than a surface area (first part of the second surface area) of the first portion 3a. The first and the second portions 3a, 3b of the gate polysilicon layer 3 have planar shapes respectively similar to the planar shapes of the first and the second portions 2a, 2b of the gate pad 2 and have surface areas at least equal to the surface areas of the first and the second portions 2a, 2b of the gate pad 2, respectively.

The first portion 3a of the gate polysilicon layer 3 opposes an entire surface of the first portion 2a of the gate pad 2, in the depth direction Z across the interlayer insulating film 11. The second portion 3b of the gate polysilicon layer 3 opposes an entire surface of the second portion 2b of the gate pad 2, in the depth direction Z across the interlayer insulating film 11. The surface areas of the first and the second portions 3a, 3b of the gate polysilicon layer 3, with consideration of process variation, may be respectively larger than the surface areas of the first and the second portions 2a, 2b of the gate pad 2.

In this manner, the first and the second portions 3a, 3b of the gate polysilicon layer 3 are provided, whereby an outer peripheral edge of the gate pad 2, along an entire perimeter, opposes the gate polysilicon layer 3, in the depth direction Z across the interlayer insulating film 11. As a result, the unevenness occurring between the gate pad 2 and the front surface of the semiconductor substrate 10 becomes smaller and therefore, metal residue due to patterning of a metal film forming the gate pad 2 decreases, whereby short circuit defects caused by metal residue become less likely to occur.

A distance L12 from an outer peripheral edge of the gate polysilicon layer 3 to the outer peripheral edge of the gate pad 2 may be, for example, at least about 3.5 μm. A reason for this is that patterning of a metal film that becomes the gate pad 2, for example, is performed by wet etching which is not conducive for fine patterns. With consideration of variation of wet etching, the distance L12 from the outer peripheral edge of the gate polysilicon layer 3 to the outer peripheral edge of the gate pad 2 may be set to the dimension described above.

The second portion 3b of the gate polysilicon layer 3 extends outwardly further than does the second portion 2b of the gate pad 2 and terminates at the edge termination region 22. Via a third contact hole 11c, a contact electrode 5 is electrically connected to a portion of the second portion 3b of the gate polysilicon layer 3 extending outwardly further than does the second portion 2b of the gate pad 2. A width W1 and a length L1 of the second portion 3b of the gate polysilicon layer 3 is a dimension that enables a greatest resistance value of the gate resistance usually used.

The second portion 3b of the gate polysilicon layer 3 is connected in series between the gate pad 2 and the gate electrodes 38, and functions as gate resistance. The gate resistance, for example, when plural MOSFET chips (semiconductor chips) having variation among the resistance values of the gate electrodes 38 are used connected in parallel, controls the flow of current to MOSFET chips in which the resistance values of the gate electrodes 38 are relatively low among the plural MOSFET chips and suppresses an occurrence of noise during MOSFET switching.

The resistance value of the gate resistance due to the second portion 3b of the gate polysilicon layer 3 is determined by a distance L2 between the second contact hole 11b of the second portion 3b of the gate polysilicon layer 3 where a contact with the second portion 2b of the gate pad 2 is formed and the third contact hole 11c of the second portion 3b of the gate polysilicon layer 3 where a contact with the contact electrode 5 is formed. The distance L2 between the second and the third contact holes 11b, 11c is changed within substantially the length L1 of the second portion 3*b* of the gate polysilicon layer 3, whereby the resistance value of the gate resistance may be adjusted.

The gate runner 4, in the edge termination region 22, is disposed in a ring-shape along the border between the active region 21 and the edge termination region 22, and surrounds a periphery of the active region 21. Further, the gate runner 4 is disposed separated from the gate polysilicon layer 3 by a predetermined distance L13, extends inwardly (toward a center portion of the semiconductor substrate 10) along the gate polysilicon layer 3, and surrounds a periphery of the gate polysilicon layer 3. An outer portion surrounding a periphery of the active region 21 and an inner portion surrounding a periphery of the gate polysilicon layer 3 as well as ends of the gate electrodes 38 are electrically connected to the gate runner 4.

All of the gate electrodes 38 are electrically connected by the gate runner 4. For example, the active region 21, as viewed from the front surface of the semiconductor substrate 10, includes an area where parts of the outer portion of the gate runner 4 oppose each other, across MOS gates in a direction (hereinafter, first direction X) in which trenches 36 (refer to FIG. 3) extend in a striped shape and an area where parts of the outer portion and parts of the inner portion of the gate runner 4 oppose each other, across MOS gates.

In the area where parts of the outer portion of the gate runner 4 oppose each other, in the first direction X across the MOS gates, both ends of each of the gate electrodes 38 are electrically connected to opposing parts of the outer portion of the gate runner 4, respectively. In the area where parts of the outer portion and parts of the inner portion of the gate runner 4 oppose each other along the first direction X across the MOS gates, one end of each of the gate electrodes 38 is electrically connected to parts of the outer portion of the gate runner 4 and the other end of each of the gate electrodes 38 is electrically connected to parts of the inner portion of the gate runner 4.

The gate runner 4 is a polysilicon layer and is positioned at a same level as the gate polysilicon layer 3. The gate runner 4, for example, may be formed concurrently with the gate polysilicon layer 3. A minimum of the distance L13 between the gate runner 4 and the gate polysilicon layer 3 may be reduced to a limit of etching accuracy and, for example, may be about 3 µm. The minimum of the distance L13 between the gate runner 4 and the gate polysilicon layer 3 is a distance between the gate runner 4 and the gate polysilicon layer 3 at a portion of the gate runner 4 along the gate polysilicon layer 3.

Further, the gate runner 4 opposes the outer peripheral edge of the source pad 1 in the depth direction Z and an inner peripheral edge opposes the source pad 1, in the depth direction Z across the interlayer insulating film 11. A distance L14 from the outer peripheral edge of the gate runner 4 to the outer peripheral edge of the source pad 1, for example, may be at least about 3.5 µm. A reason for this is as same as the reason for setting the distance L12 from the outer peripheral edge of the gate polysilicon layer 3 to the outer peripheral edge of the gate pad 2.

The inner peripheral edge of the gate runner 4, as viewed from the front surface of the semiconductor substrate 10, is an edge of the gate runner 4 toward a center (inner side) of the substantially ring-shape in which the gate runner 4 is disposed. The outer peripheral edge of the gate runner 4 is an edge on a side of the gate runner 4 opposite the inner side of the gate runner 4. The outer peripheral edge of the gate runner 4 opposes the edge termination region 22 at a portion along the border between the active region 21 and the edge termination region 22 and opposes the gate polysilicon layer 3 at a portion along the gate polysilicon layer 3.

A portion of the gate runner 4 along the border between the active region 21 and the edge termination region 22 is electrically connected to the contact electrode 5 via a fourth contact hole 11*d*. The fourth contact hole 11*d* surrounds a periphery of the active region 21 and is disposed in a substantially ring-shape opened at a portion in the gate resistance region 24. Further, the fourth contact hole 11*d* is disposed further outwardly than is the source pad 1 and does not oppose the source pad 1 in the depth direction Z.

The contact electrode 5 is disposed further outwardly than are the source pad 1 and the gate pad 2, and is separated from the source pad 1 and the gate pad 2. Further, the contact electrode 5 is provided in a substantially ring-shape along the border between the active region 21 and the edge termination region 22, and in the depth direction Z, opposes the second portion 3*b* of the gate polysilicon layer 3 and a portion of the gate runner 4 along the border of the active region 21 and the edge termination region 22.

The contact electrode 5, as described above, is electrically connected to the second portion 3*b* of the gate polysilicon layer 3 via the third contact hole 11*c* and thereby, is electrically connected to the gate pad 2 via gate resistance due to the second portion 3*b* of the gate polysilicon layer 3. Additionally, the contact electrode 5, as described above, is electrically connected to the gate runner 4 via the fourth contact hole 11*d* and thus, is electrically connected to the gate electrodes 38 via the gate runner 4.

The contact electrode 5, for example, similarly to the source pad 1, is formed using a metal containing aluminum and is positioned at the same level as the source pad 1. Therefore, when gate resistance due to the second portion 3*b* of the gate polysilicon layer 3 is connected between the gate pad 2 and the gate electrodes 38 in series, electric potential of the gate electrodes 38 may be collected at the gate pad 2 by the contact electrode 5, which has lower resistance than the resistance of the gate polysilicon layer 3.

Next, a cross-sectional structure of the semiconductor device 60 according to the first embodiment will be described. FIG. 3 is a cross-sectional view of the structure along cutting line A-A' in FIG. 2. The semiconductor substrate 10, for example, is a silicon carbide epitaxial substrate in which silicon carbide layers 51, 52 forming the n$^-$-type drift region 32 and a p-type base region (first semiconductor region) 33 are sequentially formed by epitaxial growth at a front surface of an n$^+$-type starting substrate (third semiconductor region) 31 formed using silicon carbide (SiC). The n$^+$-type starting substrate 31 is an n$^+$-type drain region.

A main surface of the semiconductor substrate 10 on a side thereof having the p-type silicon carbide layer 52 is a front surface and a main surface on a side (back surface of the n$^+$-type starting substrate 31) having the n$^+$-type starting substrate 31 is a back surface. In the active region 21, MOS gates are disposed in a region (third region) 21' excluding the gate pad region 23 and the gate resistance region 24. The MOS gates include the p-type base region 33, the n$^+$-type source region 34, the p$^+$-type contact region 35, the trenches 36, the gate insulating film 37, and the gate electrodes 38.

In particular, in the active region 2, the n$^+$-type source region 34 and the p$^+$-type contact region 35 are each selectively provided in the p-type silicon carbide layer 52, from the front surface of the semiconductor substrate 10 to a depth not reaching the n$^-$-type silicon carbide layer 51. The trenches 36, in the active region 21, penetrate the n$^+$-type source region 34 and the p-type silicon carbide layer 52 in the depth direction Z from the front surface of the semiconductor substrate 10 and terminate in the n⁻-type silicon carbide layer 51.

The trenches 36 are disposed in a striped shape extending in a direction (hereinafter, first direction) X parallel to the front surface of the semiconductor substrate 10. While not depicted, ends of the trenches 36 terminate at an outer peripheral portion of the gate polysilicon layer 3 and oppose the outer peripheral portion of the gate polysilicon layer 3, in the depth direction Z across the interlayer insulating film 11. Ends of the trenches 36 that are adjacent to each other may be connected and the trenches 36 may be provided in a ring-shape as viewed from the front surface of the semiconductor substrate 10.

In the trenches 36, the gate insulating film 37 is provided along inner walls (side walls and bottoms) of the trenches 36. The gate insulating film 37 extends on the front surface of the semiconductor substrate 10 and covers the front surface of the semiconductor substrate 10 in the gate pad region 23 and the gate resistance region 24. The gate electrodes 38 are provided on the gate insulating film 37 in the trenches 36 and oppose the n⁺-type source region 34, across the gate insulating film 37 at the side walls of the trenches 36.

A portion of the p-type silicon carbide layer 52 excluding the n⁺-type source region 34, the p⁺-type contact region 35, the trenches 36, an n⁻-type region 32', and a p-type region 33' is the p-type base region 33. The p-type region 33' is a portion of the p-type silicon carbide layer 52 having the gate pad region 23 and the gate resistance region 24, and is separated from the p-type base region 33 by the n⁻-type region 32'. In other words, directly beneath (drain side) the gate pad 2, the p-type region 33' alone is provided and no MOS gate is provided.

The p-type region 33' is provided spanning the gate pad region 23 and the gate resistance region 24. The n⁻-type region 32' surrounds a periphery of a region continuous from the gate pad region 23 to the gate resistance region 24. The n⁻-type region 32' penetrates through the p-type silicon carbide layer 52 in the depth direction Z and reaches the n⁻-type silicon carbide layer 51. The n⁻-type region 32' is in contact with a portion of the n⁻-type silicon carbide layer 51 forming the n⁻-type drift region 32 and functions as an n⁻-type drift region.

Further, in the active region 21, an n-type current spreading region 40 and first and second p⁺-type regions 41, 42 may be provided in the n⁻-type silicon carbide layer 51. A portion of the n⁻-type silicon carbide layer 51 excluding the n-type current spreading region 40 and the first and the second p⁺-type regions 41, 42 is the n⁻-type drift region 32. The n-type current spreading region 40 is a so-called current spreading layer (CSL) that reduces carrier spreading resistance.

The n-type current spreading region 40 is provided between (mesa region) the trenches 36 that are adjacent to each other and reaches each side wall of the adjacent trenches 36 sandwiching the mesa region. Each n-type current spreading region 40 is in contact with the p-type base region 33 and from a border between the p-type base region 33 and the n-type current spreading region 40, reaches a position deeper on a drain side (closer to the n⁺-type starting substrate 31) than are the bottoms of the trenches 36. The n-type current spreading regions 40 may be in contact with the first and the second p⁺-type regions 41, 42.

Each first p⁺-type region 41 is provided separated from the p-type base region 33, at a position deeper on the drain side than is the p-type base region 33 and opposes the bottom of one the trenches 36 in the depth direction Z. Each second p⁺-type region 42 is provided in a mesa region, separated from the first p⁺-type region 41 and the trenches 36, and is in contact with the p-type base region 33. The first and the second p⁺-type regions 41, 42 have a function of suppressing electric field applied to the gate insulating film 37 when the MOSFET is OFF.

The interlayer insulating film 11 is provided on the front surface of the semiconductor substrate 10 overall so as to cover the gate electrodes 38 and the gate insulating film 37 extending on the front surface of the semiconductor substrate 10. In the gate pad region 23 and the gate resistance region 24, the gate polysilicon layer 3 is provided between the interlayer insulating film 11 and the gate insulating film 37. The gate polysilicon layer 3 opposes the p-type region 33', in the depth direction Z across the gate insulating film 37.

The first to the fourth contact holes 11a to 11d that pass through the interlayer insulating film 11 and the gate insulating film 37 in the depth direction Z are provided. In the first contact holes 11a, the n⁺-type source region 34 and the p⁺-type contact region 35 are exposed. The second contact hole 11b is positioned closer to the gate pad region 23 than is the third contact hole 11c. In the second and the third contact holes 11b, 11c, the second portion 3b of the gate polysilicon layer 3 is exposed. In the fourth contact hole 11d (refer to FIG. 2), the gate runner 4 is exposed.

The source pad 1, in a portion of the active region 21 excluding the gate pad region 23 and the gate resistance region 24, is provided on the interlayer insulating film 11 so as to be embedded in the first contact holes 11a. The source pad 1, in the first contact holes 11a, is in contact with the n⁺-type source region 34 and the p⁺-type contact region 35, and forms a contact with the n⁺-type source region 34 and the p⁺-type contact region 35.

The gate pad 2 is provided on the interlayer insulating film 11, spanning the gate pad region 23 and the gate resistance region 24 so as to be embedded in the second contact hole 11b. The first and the second portions 2a, 2b of the gate pad 2 respectively oppose the first and the second portions 3a, 3b of the gate polysilicon layer 3, in the depth direction Z across the interlayer insulating film 11. The second portion 2b of the gate pad 2, in the second contact hole 11b, is in contact with the second portion 3b of the gate polysilicon layer 3 and forms a contact with the second portion 3b of the gate polysilicon layer 3.

The contact electrode 5 is provided on the interlayer insulating film 11, along the border between the active region 21 and the edge termination region 22 so as to be embedded in the third and the fourth contact holes 11c, 11d. The contact electrode 5 opposes the second portion 3b of the gate polysilicon layer 3 and the gate runner 4 (refer to FIG. 2), in the depth direction Z across the interlayer insulating film 11. The contact electrode 5, in the third contact hole 11c, is in contact with the second portion 3b of the gate polysilicon layer 3 and forms a contact with the second portion 3b of the gate polysilicon layer 3. The contact electrode 5, in the fourth contact hole 11d, is in contact with the gate runner 4 and forms a contact with the gate runner 4.

A passivation film 12 is an uppermost layer of the front surface of the semiconductor substrate 10 and is a protective film that protects the front surface of the semiconductor substrate 10. In the passivation film 12, openings that expose a region of the source pad 1 and a region of the gate pad 2 where wiring is bonded are formed. A drain electrode (second electrode) 43 is provided at the back surface of the semiconductor substrate 10 overall. The drain electrode 43 is in contact with the n⁺-type drain region configured by the n⁺-type starting substrate 31 and forms a contact with the n⁺-type drain region.

Figure 4:
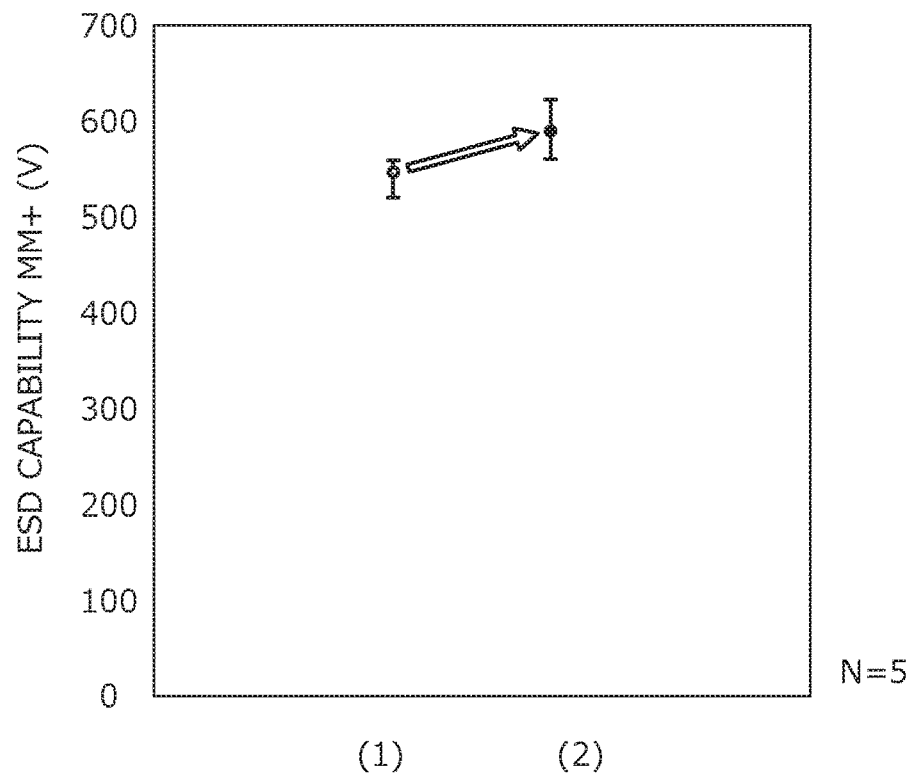
FIG. 4 is a graph depicting ESD capability versus oxide film thickness and cell pitch of the semiconductor device.

Here, FIG. 4 is a graph depicting ESD capability versus oxide film thickness and cell pitch of the semiconductor device. In FIG. 4, (1) is ESD capability of the semiconductor device 60 in which gate resistance and the gate polysilicon layer 3 in the gate pad region 23 were not provided and (2) is ESD capability of the semiconductor device 60 in which gate resistance and the gate polysilicon layer 3 in the gate pad region 23 were provided. A vertical axis represents ESD capability of the semiconductor device 60 in units of V. Cell pitch is a distance between a center of one of the trenches 36 of the active region 21 and a center of another of the trenches 36 adjacent to the one trench. Oxide film thickness is film thickness of the gate insulating film 37. Further, these values are results in a case in which the number of samples N was 5.

As depicted in FIG. 4, in comparing (1) and (2), since the gate polysilicon layer 3 was provided in the gate pad region 23, capacitance of a region in which the gate pad was provided and capacitance of a region in which gate resistance was provided increased, whereby the ESD capability increased. In this manner, by providing the gate polysilicon layer 3, the ESD capability may be increased.

Here, a region in which MOS structures of the active region 21 were provided is a portion where the source pad was provided and MOS structures were formed, the portion in the active region 21 depicted in FIGS. 1 and 2, excluding the gate pad region 23 and the gate resistance region 24. Further, the region in which the gate pad was provided is a region excluding the second portion 2b, from the gate pad 2 provided on the gate polysilicon layer 3 surrounded by the third contact hole 11c, the region having the first portion 2a of the gate pad 2 (refer to FIG. 2). Further, the second portion 3b of the gate polysilicon layer 3 functions as gate resistance and therefore, the region in which gate resistance was provided is a region having the second portion 3b of the gate polysilicon layer 3 disposed in the gate pad region 23 (refer to FIG. 2).

While not depicted in FIG. 4, the ESD capability of the semiconductor device 60 in which gate resistance was provided and the gate polysilicon layer 3 in the gate pad region 23 was not provided was less than that of the semiconductor device 60 of (1) under the same conditions. This is because when gate resistance is provided, the ESD capability is determined by the capacitance of the region in which gate resistance is provided and the capacitance of the region in which the gate pad is provided and thus, the ESD capability decreased.

Figure 5:
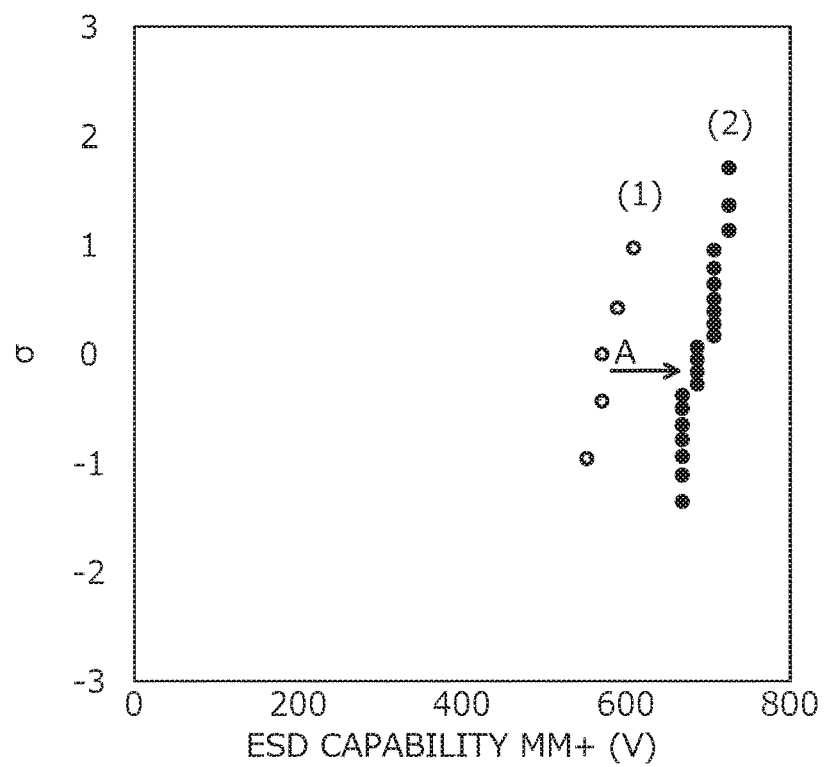
FIG. 5 is a graph depicting a normal probability distribution plot of ESD capability of the semiconductor device of various chip angles.

Further, FIG. 5 is a graph depicting a normal probability distribution plot of ESD capability of the semiconductor device of various chip angles. In FIG. 5, a horizontal axis represents ESD capability in units of V. Further, a vertical axis represents standard deviation a. In FIG. 5, (1) is the semiconductor device 60, and (2) is the ESD capability of the semiconductor device 60 in which an active mathematical area was 1.83 times larger than that of (1). Further, (1) to (2) are the ESD capabilities of the semiconductor device 60 in which gate resistance and the gate polysilicon layer 3 in the gate pad region 23 were provided.

As depicted in FIG. 5, in comparing (1) and (2), the mathematical area of the semiconductor substrate 10 increased, the mathematical area of the region in which the MOS structures of the active region 21 were provided increased, the capacitance increased, and the ESD capability increased (arrow A in FIG. 5).

Here, the mathematical area of the gate pad was constant at 0.476 mm², independent of the size of the semiconductor substrate 10. On the other hand, in (2), the mathematical area of the region in which the MOS structures of the active region 21 were provided was 9.9 mm², which was 20.8 times the mathematical area of the gate pad region 23. Further, in (1), the mathematical area of the region in which the MOS structures of the active region 21 were provided was 5.4 mm², which was 11.3 times the mathematical area of the gate pad region 23. Here, the mathematical area of the gate pad is the mathematical area of the region in which the gate pad was provided. Further, the mathematical area of the gate resistance is the mathematical area of the region in which the gate resistance was provided.

In FIG. 5, in (1) and (2) (arrow A in FIG. 5), while the mathematical area of the region in which the MOS structures of the active region 21 were provided increased 1.82 times from 5.4 mm² to 9.9 mm², the ESD capability was a value that was 1.82 times smaller. In the case of (1), the capacitance of the region in which the MOS structures of the active region 21 was provided was smallest while in the case of (2), the region in which the gate resistance was provided was the smallest. Therefore, in the case of (2), this was because the region in which the gate resistance was provided was destroyed by static electricity of a large voltage and the ESD capability was not increased.

Increasing the ESD capability of the region in which the MOS structures of the active region 21 are provided is difficult and therefore, in the semiconductor device 60 of the first embodiment, the gate polysilicon layer 3 is provided in the gate pad region 23. As a result, the capacitance of the region in which the gate pad is provided and the capacitance of the region in which the gate resistance is provided are increased, and the capacitance of the region in which the gate pad is provided and the ESD capability of the region in which the gate resistance is provided are increased. In particular, the ESD capability of the semiconductor device 60 is determined by the region in which the gate pad is provided and therefore, the capacitance of the region in which the gate pad is provided is increased and the ESD capability is increased.

A capacitance C is obtained by $C=\varepsilon \cdot S/d$, where c is permittivity of the insulating film, S is the mathematical area of the insulating film, and d is the thickness of the insulating film. Therefore, for example, the mathematical areas of the gate insulating film 37 and the interlayer insulating film 11 are increased by the gate polysilicon layer 3, the gate insulating film 37 and the interlayer insulating film 11 are thinner, and the gate insulating film 37 and the interlayer insulating film 11 having high permittivity are used, whereby the capacitance of the region in which the gate pad is provided and the capacitance of the region in which the gate resistance is provided is increased and the ESD capability increases.

Further, in the first embodiment, the capacitance of the region in which the gate pad is provided is set to be larger than the capacitance of the region in which the gate resistance is provided, or the capacitance of the region in which the gate pad is provided is set to be larger than the capacitance of the region in which the MOS structures of the active region 21 are provided. As a result, the ESD capability of the region in which the gate pad is provided becomes greater than the ESD capability of the region in which the gate resistance is provided, or the ESD capability of the region in which the gate pad is provided becomes greater than the ESD capability of the region in which the MOS structures of the active region 21 are provided.

Further, the capacitance of the region in which the MOS structures of the active region 21 are provided may be set to be larger the capacitance of the region in which the gate resistance is provided. As a result, the ESD capability of the region in which the MOS structures of the active region 21 are provided becomes greater than the ESD capability of the region in which the gate resistance is provided.

Here, as described above, the capacitance C may be obtained by $C=\varepsilon \cdot S/d$. Therefore, to increase the capacitance C, the thickness d may be reduced. Therefore, for example, the interlayer insulating film 11 sandwiched between the gate pad 2 and the gate polysilicon layer 3, or the gate insulating film 37 sandwiched between the gate polysilicon layer 3 and the semiconductor substrate 10 is set to be thicker than the gate insulating film 37 of the region in which the MOS structures of the active region 21 are provided, whereby the capacitance of the region in which the MOS structures of the active region 21 are provided may be set to be larger than the capacitance of the region in which the gate pad is provided. Further, the gate insulating film 37 of the region in which the gate resistance is provided is set to be thicker than the gate insulating film 37 of the region in which the MOS structures of the active region are provided, whereby the capacitance of the region in which the gate resistance is provided may be set to be smaller than the capacitance of the region in which the MOS structures of the active region 21 are provided.

Moreover, between the semiconductor substrate 10 and the gate insulating film 37 of the region in which the gate pad is provided and that of the region in which the gate resistance is provided, an oxide film that is a thin deposited film is further provided, whereby the capacitance of the region in which the gate resistance is provided may be set to be smaller than the capacitance of the region in which the MOS structures of the active region 21 are provided.

Further, the capacitance C varies according to the permittivity c and therefore, for example, by setting the permittivity of the interlayer insulating film 11 sandwiched between the gate pad 2 and the gate polysilicon layer 3, or the permittivity of the gate insulating film 37 sandwiched between the gate polysilicon layer 3 and the semiconductor substrate 10 to be lower than the permittivity of the gate insulating film 37 of the region in which the MOS structures of the active region 21 are provided, the capacitance of the region in which the MOS structures of the active region 21 are provided may be set to be larger than the capacitance of the region in which the gate pad is provided. Further, by setting the permittivity of the gate insulating film 37 of the region in which the gate resistance is provided to be lower than the permittivity of the gate insulating film 37 of the region in which the MOS structures of the active region are provided, the capacitance of the region in which the gate resistance is provided may be set to be smaller than the capacitance of the region in which the MOS structures of the active region 21 are provided.

Further, regarding oxide films, the interlayer insulating film 11 sandwiched between the gate pad 2 and the gate polysilicon layer 3 may be an oxide film that contains phosphorus (P) and the gate insulating film 37 may be an oxide film that contains nitrogen (N).

Further, the capacitance C varies according to the mathematical area S and therefore, for example, by setting the mathematical area of the region in which the gate resistance is provided to be smaller than the mathematical area of the region in which the gate pad is provided, the capacitance of the region in which the gate resistance is provided may be set to be smaller than the capacitance of the region in which the gate pad is provided. Further, by setting the mathematical area of the region in which the gate resistance is provided to be smaller than the mathematical area of the region in which the MOS structures of the active region 21 are provided, the capacitance of the region in which the gate resistance is provided may be set to be smaller than the capacitance of the region in which the MOS structures of the active region 21 are provided.

Further, in the first embodiment, while the gate polysilicon layer 3 is electrically connected to the gate electrodes 38 and has an electric potential equal to that of the gate electrodes 38, the gate polysilicon layer 3 may be electrically connected to the source pad 1 that is in contact with the $n^+$-type source region 34 and the $p^+$-type contact region 35, and the gate polysilicon layer 3 may have an electric potential equal to that of the source pad 1. When the gate polysilicon layer 3 has an electric potential equal to that of the source pad 1, in an instance of short circuiting (shorting) by the gate polysilicon layer 3 and the gate electrodes 38 due to damage of the interlayer insulating film 11, the gate and the source short, resulting in a defect. Therefore, the gate polysilicon layer 3 may preferably have an electric potential equal to that of the gate electrodes 38.

As described above, according to the first embodiment, the gate polysilicon layer disposed on the front surface of the semiconductor substrate via the gate insulating film is configured by the first and the second portions of differing surface areas. As a result, the gate resistance connected in series between the gate pad and the gate runner (gate electrode) is configured by the second portion of that gate polysilicon layer having the relatively smaller surface area. The resistance value of the gate resistance may be easily adjusted by the distance between the contact between the gate pad and the second portion of the gate polysilicon layer and the contact between the gate runner and the second portion of the gate polysilicon layer.

Further, according to the first embodiment, the gate polysilicon layer is configured by the first and the second portions of differing surface areas, whereby the surface area of the gate polysilicon layer overall is increased by the first portion that in the gate polysilicon layer, has a surface area larger than the surface area of the second portion configuring the gate resistance. As a result, even when a large amount of charge due to ESD or the like is injected in the gate pad, voltage applied to the oxide film (gate insulating film) of the layer beneath the gate polysilicon layer is distributed and therefore, dielectric breakdown of the oxide film may be suppressed. Thus, ESD tolerance may be enhanced without affecting the resistance value of the gate resistance resulting from the second portion of the gate polysilicon layer.

Further, according to the first embodiment, the outer peripheral edge of the gate pad entirely opposes the gate polysilicon layer, in the depth direction across the interlayer insulating film and therefore, unevenness between the gate pad and the front surface of the semiconductor substrate may be reduced and problems arising due to the unevenness are less likely to occur, whereby yield may be enhanced. Further, the gate pad and the gate polysilicon layer may be disposed in a region of a surface area substantially equal to the surface area of the gate polysilicon layer, thereby enabling size reductions of the semiconductor chip.

Further, according to the first embodiment, the gate resistance due to the second portion of the gate polysilicon layer is built into the same semiconductor substrate as the MOSFET, thereby enabling the MOSFET to be provided at a lower cost as compared to a case in which the gate resistance is configured by a separate component.

Further, according to the first embodiment, the gate polysilicon layer is provided in the gate pad region. As a result, the capacitance of the region in which the gate pad is provided and the capacitance of the region in which the gate resistance is provided are set to be large, and the capacitance of the region in which the gate pad is provided and the ESD capability of the region in which the gate resistance is provided are increased.

Further, according to the first embodiment, the capacitance of the region in which the MOS structures of the active region are provided is larger than the capacitance of the region in which the gate resistance is provided. As a result, the ESD capability of the region in which the MOS structures of the active region are provided is greater than the ESD capability of the region in which the gate resistance is provided, thereby enabling destruction of the MOS structures of the active region to be prevented.

Figure 6:
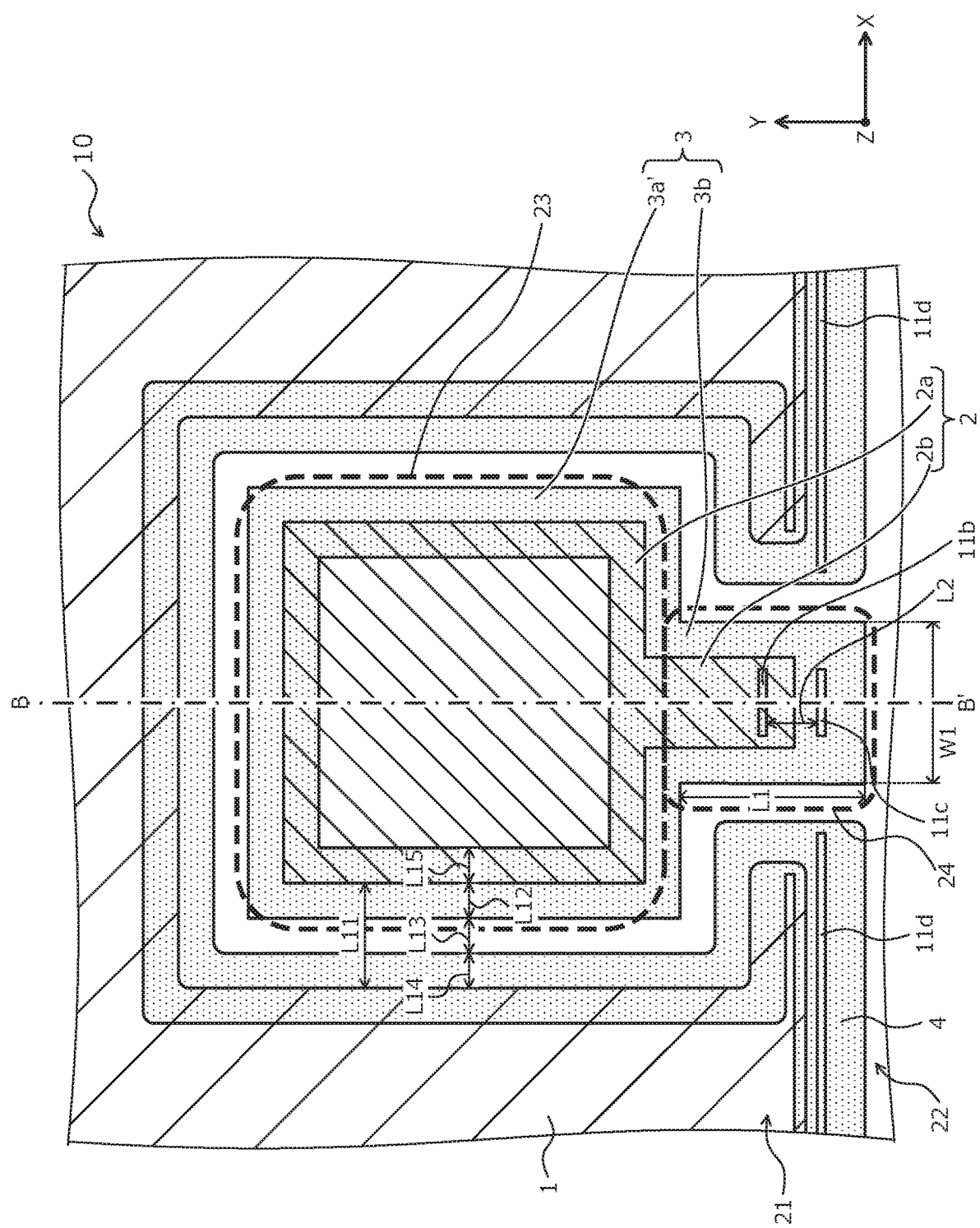
FIG. 6 is a plan view of a layout of a portion of the semiconductor device according to a second embodiment, as viewed from the front surface of the semiconductor substrate.
Figure 7:
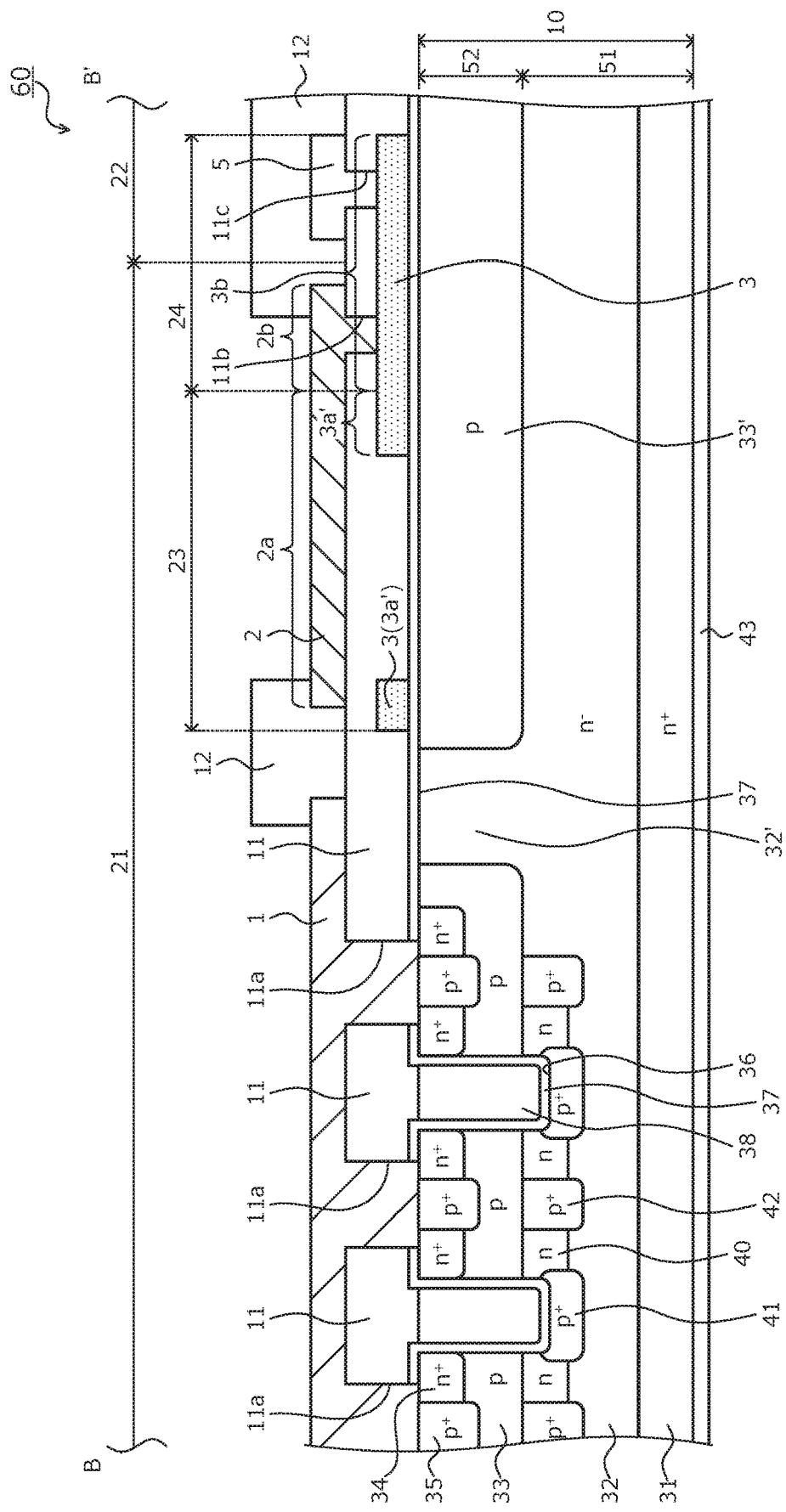
FIG. 7 is a cross-sectional view of a structure along cutting line B-B' in FIG. 6.

A structure of the semiconductor device according to a second embodiment will be described. FIG. 6 is a plan view of a layout of a portion of the semiconductor device according to the second embodiment, as viewed from the front surface of the semiconductor substrate. FIG. 7 is a cross-sectional view of the structure along cutting line B-B' in FIG. 6. A layout of the semiconductor device 60 according to the second embodiment overall, as viewed from the front surface of the semiconductor substrate 10 is similar to that depicted in FIG. 1, in which the first portion 3a of the gate polysilicon layer 3 is replaced with a first portion 3a' of the gate polysilicon layer 3 depicted in FIG. 6.

The semiconductor device 60 according to the second embodiment differs from the semiconductor device 60 according to the first embodiment in that the first portion 3a' of the gate polysilicon layer 3 alone has a substantially ring-shaped planar shape. A distance L15 from an inner peripheral edge of the first portion 3a' of the gate polysilicon layer 3 to the outer peripheral edge of the gate pad 2, with consideration of variation of wet etching, for example, may be about at least 5 μm. The first portion 2a of the gate pad 2, similarly to the first embodiment, has a substantially rectangular planar shape.

A planar outline (contour of the outer peripheral edge) of the first portion 2a of the gate pad 2 is similar to a planar outline of the first portion 3a' of the gate polysilicon layer 3. The first portion 2a of the gate pad 2, at the outer peripheral edge, opposes the first portion 3a' of the gate polysilicon layer 3, in the depth direction Z across the interlayer insulating film 11. The outer peripheral edge of the gate pad 2 is positioned between the inner peripheral edge and an outer peripheral edge of the first portion 3a' of the gate polysilicon layer 3.

As described above, according to the second embodiment, effects similar to those of the first embodiment may be obtained. Further, according to the second embodiment, the first portion of the gate polysilicon layer has a substantially ring-shape planar shape, thereby enabling the capacitance occurring at a portion of the gate insulating film sandwiched between the first portion of the gate polysilicon layer and the semiconductor substrate to be adjusted.

Figure 8:
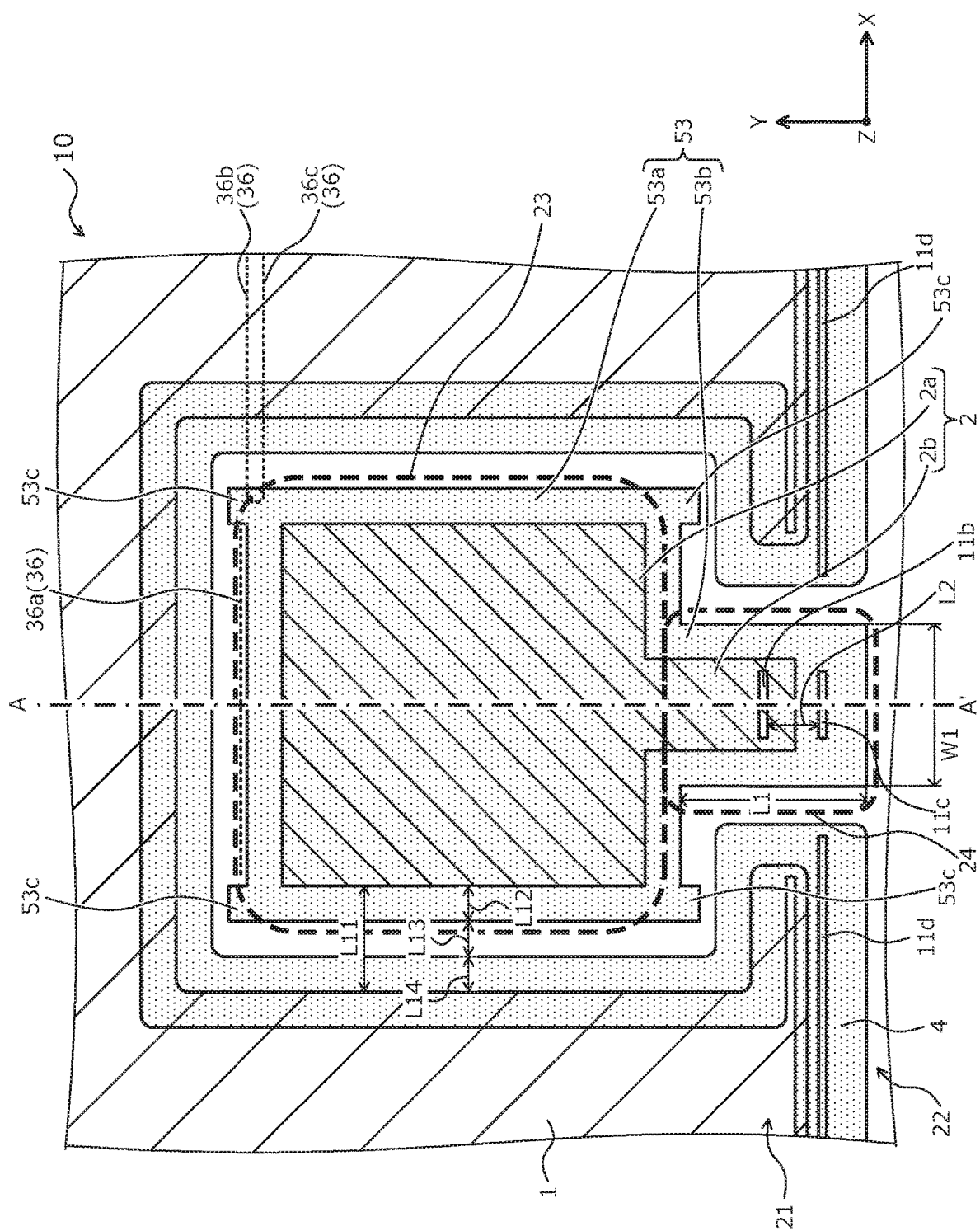
FIG. 8 is a plan view of a layout of a portion of the semiconductor device according to a third embodiment, as viewed from the front surface of the semiconductor substrate.
Figure 9:
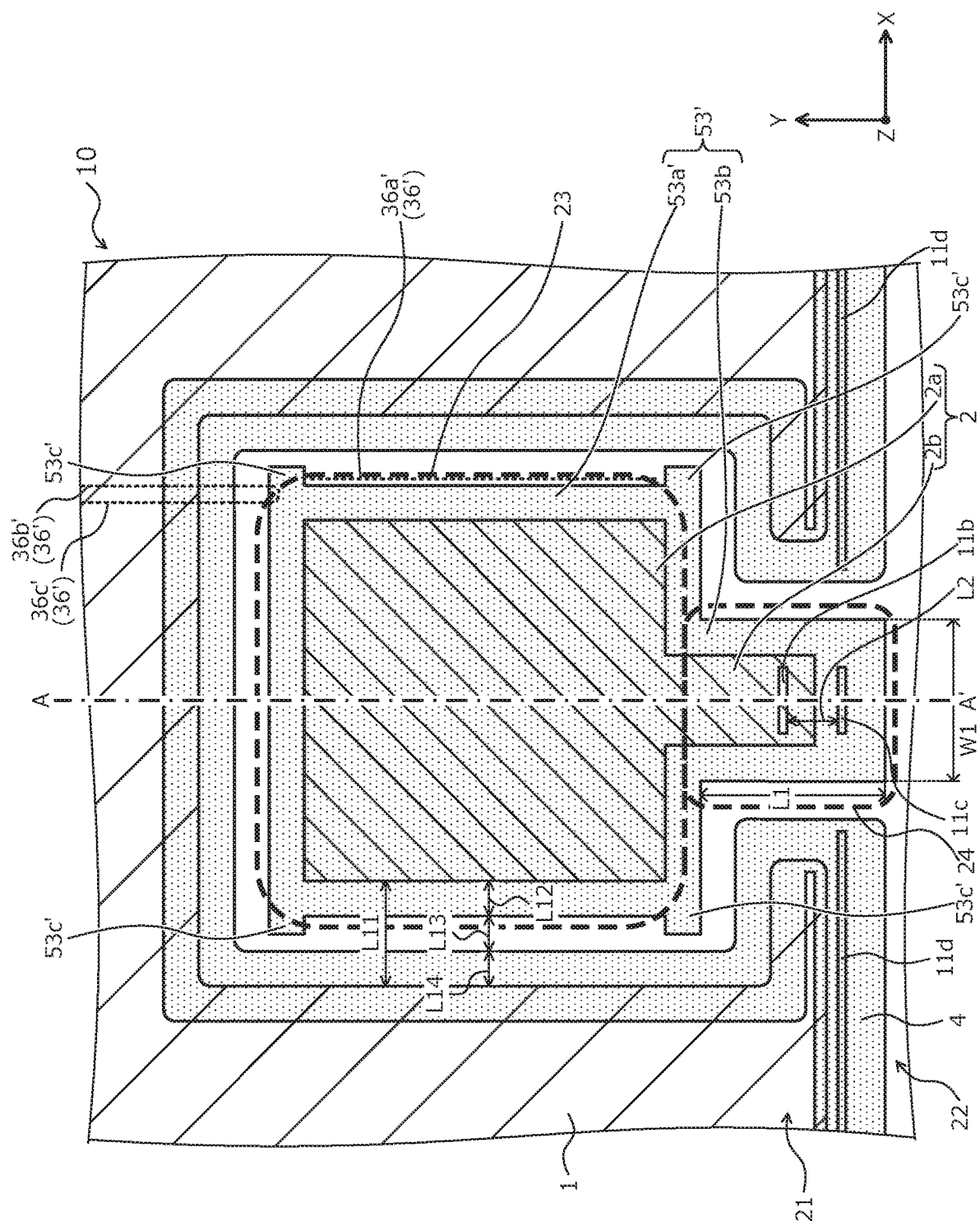
FIG. 9 is a plan view of another example of a layout of a portion of the semiconductor device according to the third embodiment, as viewed from the front surface of the semiconductor substrate.
Figure 10:
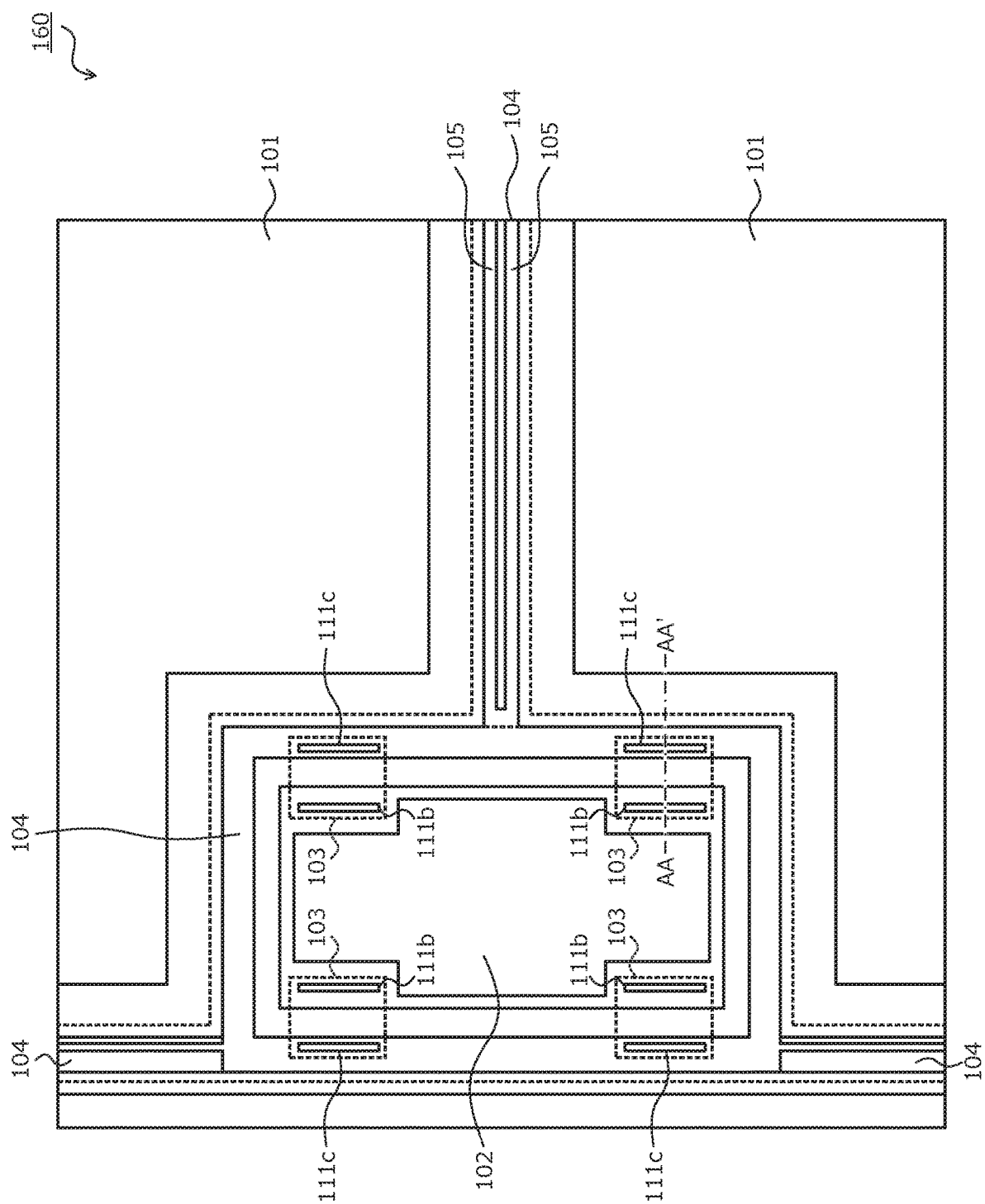
FIG. 10 is a plan view of a layout near a gate pad of a conventional semiconductor device, as viewed from a front surface of a semiconductor substrate.
Figure 11:
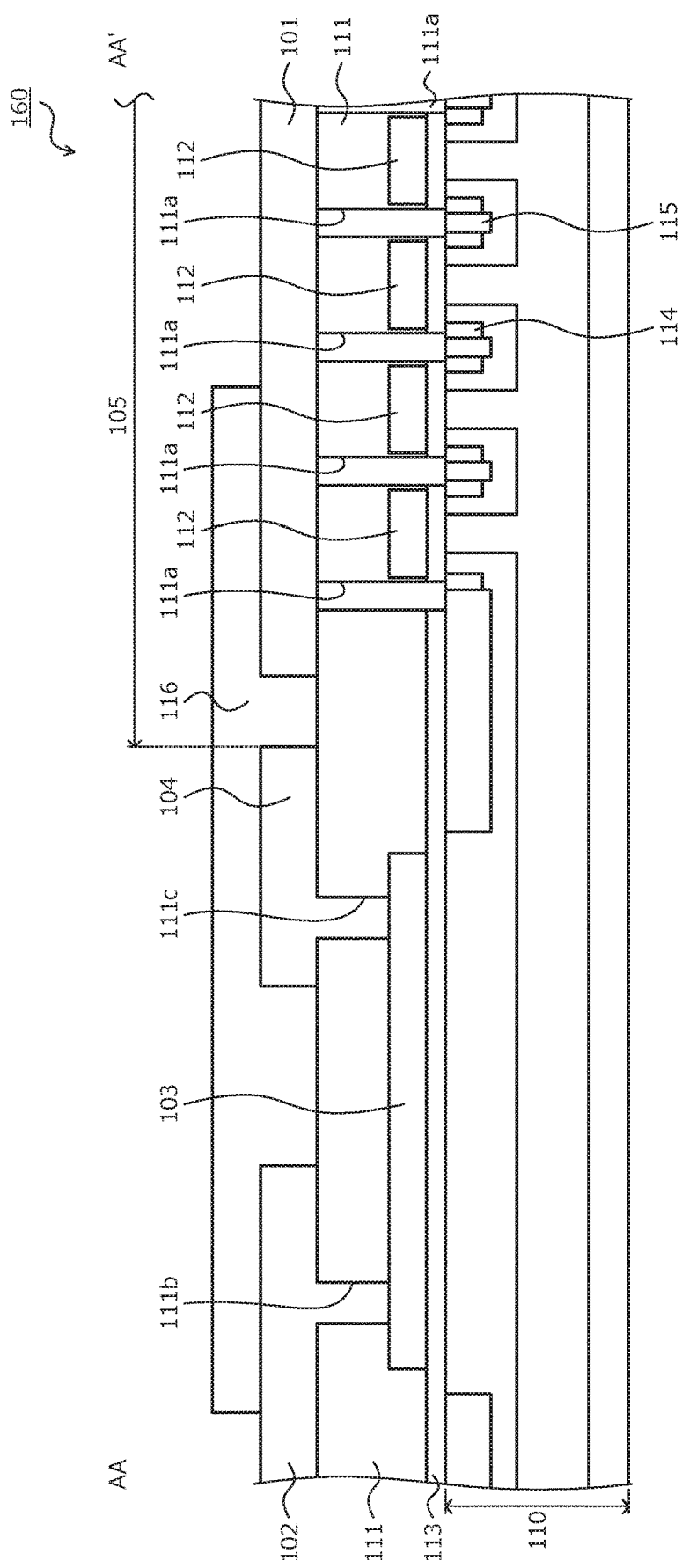
FIG. 11 is a cross-sectional view of a structure along cutting line AA-AA' in FIG. 10.
Figure 12:
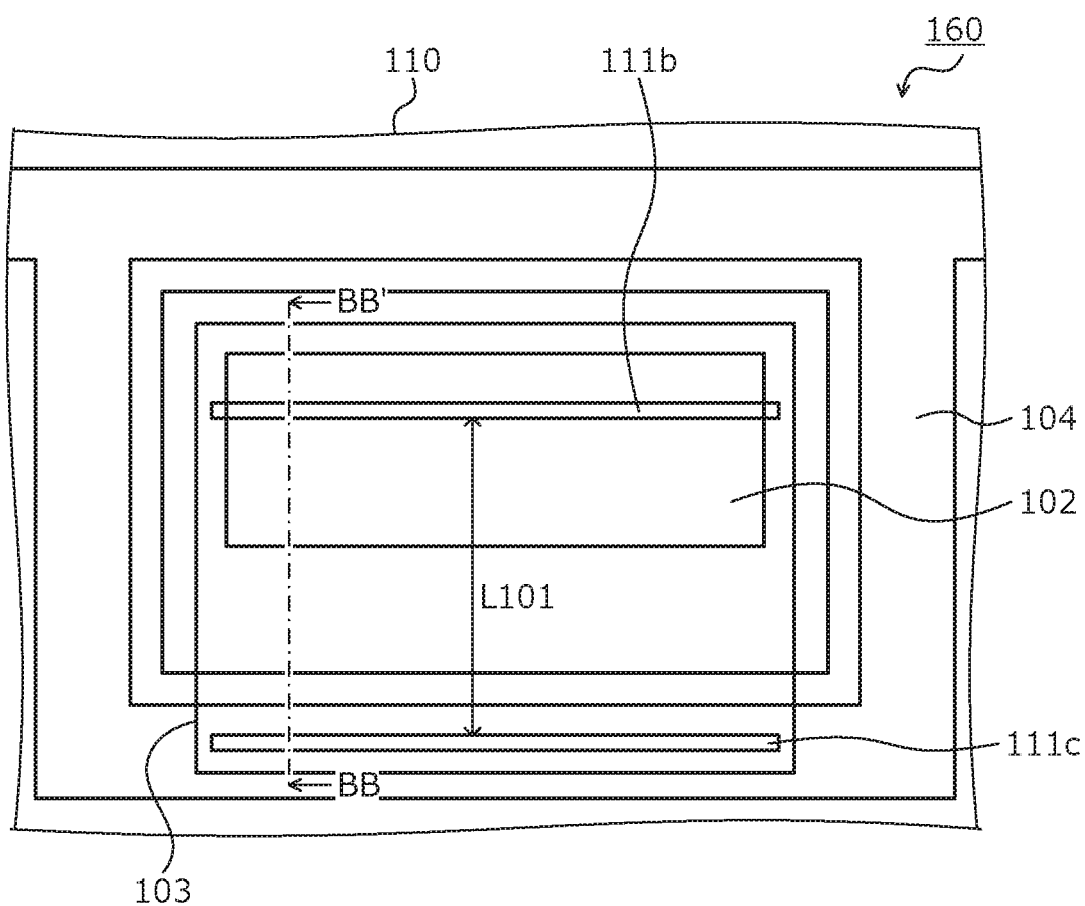
FIG. 12 is a plan view of an example of another layout near the gate pad of the conventional semiconductor device, as viewed from the front surface of the semiconductor substrate.
Figure 13:
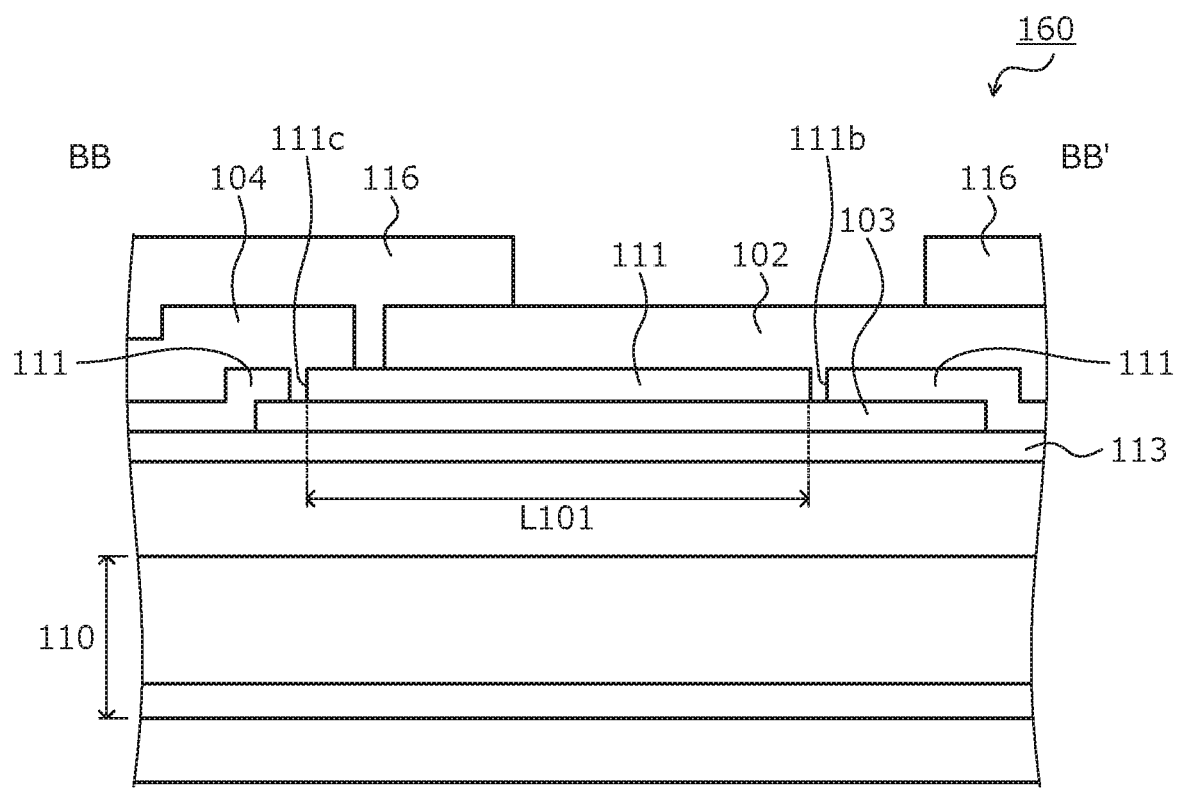
FIG. 13 is a cross-sectional view of a structure along cutting line BB-BB' in FIG. 12.

A structure of the semiconductor device according to a third embodiment will be described. FIG. 8 is a plan view of a layout of a portion of the semiconductor device according to the third embodiment, as viewed from the front surface of the semiconductor substrate. FIG. 9 is a plan view of another example of a layout of a portion of the semiconductor device according to the third embodiment, as viewed from the front surface of the semiconductor substrate. A layout of the semiconductor device 60 according to the third embodiment overall, as viewed from the front surface of the semiconductor substrate 10 is similar to that in which the first portion 3a of the gate polysilicon layer 3 depicted in FIG. 1 is replaced with first portions 53a, 53a' of gate polysilicon layers 53, 53' depicted in FIGS. 8 and 9.

The semiconductor device 60 according to the third embodiment differs from the semiconductor device 60 according to the first embodiment in that the first portion 53a of the gate polysilicon layer 53 has a planar shape that is substantially a rectangular shape and has third portions 53c that protrude from each end of one pair of opposite sides of the substantially rectangular shape. The third portions 53c of the gate polysilicon layer 53 are respectively provided at each end of the sides of the first portion 53a of the gate polysilicon layer 53 parallel to the first direction X along which the trenches 36 extend in a striped shape.

The third portions 53c of the gate polysilicon layer 53 need not be provided at sides of the first portion 53a of the gate polysilicon layer 53 parallel to a direction (hereinafter, second direction) Y that is parallel to the front surface of the semiconductor substrate 10 and orthogonal to the first direction X. The third portions 53c are provided in the gate polysilicon layer 53 and thereby, reduce a distance between ends of the trenches 36 substantially opposing each other across the third portions 53c and enable the trenches 36 to be disposed.

For example, near the gate polysilicon layer 53, along a side of the gate polysilicon layer 53 parallel to the first direction X, a trench 36a (36) is disposed in a straight line parallel to the first direction X. The third portions 53c are provided in the first portion 53a of the gate polysilicon layer 53 so as to sandwich the trench 36a (36). In other words, between the third portions 53c of the gate polysilicon layer 53 adjacent to each other along the first direction X, the trench 36a (36) is disposed in a straight line extending parallel to the first direction X.

In this manner, the third portions 53c are provided in the gate polysilicon layer 53, whereby other trenches 36b (36), 36c (36) substantially opposing an end of the trench 36a across the third portions 53c of the gate polysilicon layer 53 may be disposed so as to oppose an outer peripheral portion of the first portion 53a of the gate polysilicon layer 53 in the depth direction Z. In FIG. 8, the trenches 36a to 36c are indicated by a dashed line finer than a dashed line indicating the gate pad region 23 and the trenches 36 other than the trenches 36a to 36c are not depicted. Further, in FIG. 8, ends of the trenches 36b, 36c that are adjacent to each other are depicted in a connected stated.

As depicted in FIG. 9, when trenches 36' are disposed in a striped shape extending along the second direction Y, the first portion 53a' of the gate polysilicon layer 53' has at a side parallel to the second direction Y, third portions 53c' that protrude from each end and the first portion 53a' has a planar shape in which the third portions 53c' are not provided on a side parallel to the first direction X. In FIG. 9, the trenches 36' (36a' to 36c') are indicated by a dashed line similar to that of the trenches 36 in FIG. 8 and the trenches 36' other than the trenches 36a' to 36c' are not depicted. Furthermore, in FIG. 9, ends of the trenches 36b', 36c' that are adjacent to each other are depicted in a connected state.

The second embodiment may be applied to the third embodiment and the first portions 53a, 53a' of the gate polysilicon layers 53, 53' may have a substantially ring-shaped planar shape.

As described above, according to the third embodiment, effects similar to those of the first and the second embodiment may be obtained. Further, according to the third embodiment, ends are closer in the direction in which the trenches extend in a striped shape, enabling the trenches to be disposed, whereby size reductions of the semiconductor chip are possible.

In the foregoing, the present invention is not limited to the embodiments described above and various modifications within a range not departing from the spirit of the invention are possible. For example, in the embodiments described above, while a case in which the planar outline of the gate polysilicon layer is similar to the planar outline of the gate pad has been described as an example, the outer peripheral edge of the gate pad suffices to oppose the gate polysilicon layer in the depth direction across the interlayer insulating film, and the planar outline of the gate polysilicon layer may differ from the planar outline of the gate pad. The present invention is not limited to trench gate MOSFETs and is further applicable to trench gate IGBTs. The present invention is similarly implemented when conductivity types (n-type, p-type) are reversed.

According to the present invention, the overall surface area of the gate polysilicon layer provided on a first main surface of the semiconductor substrate via an oxide film may be set to be large. Therefore, even when a large amount of charge due to ESD or the like is injected in the gate pad, voltage applied to the oxide film of the layer beneath the gate polysilicon layer may be distributed, thereby enabling dielectric breakdown of the oxide film to be suppressed. Further, according to the present invention, the outer peripheral edge of the gate pad opposes the gate polysilicon layer in the depth direction across the interlayer insulating film and therefore, unevenness between the gate pad and the front surface of the semiconductor substrate may be reduced and problems arising due to the unevenness are less likely to occur.

Further, the gate polysilicon layer is provided in the gate pad region. As a result, the capacitance of the region in which the gate pad is provided and the capacitance of the region in which the gate resistance is provided are increased, the capacitance of the region in which the gate pad is provided and the ESD capability of the region in which the gate resistance is provided are increased.

Further, the capacitance of the region in which the MOS structures of the active region are provided is greater than the capacitance of the region in which the gate resistance is provided. As a result, the ESD capability of the region in which the MOS structures of the active region are provided is greater than the ESD capability of the region in which the gate resistance is provided. Therefore, destruction of the MOS structure in the active region may be suppressed.

The semiconductor device achieves an effect in that the ESD tolerance and yield may be enhanced.

As described above, the semiconductor device according to the present invention is useful for semiconductor devices having a configuration in which gate resistance is connected in series between the gate pad and the gate electrode.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device having an active region in which a Metal-Oxide-Semiconductor (MOS) structure including a MOS transistor is configured, and in which current flows during an ON state of the MOS transistor, the semiconductor device, comprising:

a semiconductor substrate having a first main surface and a second main surface opposite to the first main surface;

a gate electrode provided on the semiconductor substrate via a gate insulating film, the gate electrode and the gate insulating film constituting a part of the MOS transistor;

an interlayer insulating film provided on the first main surface of the semiconductor substrate;

an oxide film provided on the first main surface of the semiconductor substrate;

a gate pad having a first surface area in a plan view, and being provided on the first main surface of the semiconductor substrate via the interlayer insulating film in the active region, the interlayer insulating film being provided between the semiconductor substrate and the gate pad;

a gate polysilicon layer including a gate resistance, and having a second surface area in the plan view, the gate polysilicon layer facing the gate pad in a depth direction, via the interlayer insulating film, and being electrically insulated from the semiconductor substrate by the oxide film, the oxide film being disposed between the semiconductor substrate and the gate polysilicon layer; and a thin deposited film of oxide, provided between the oxide film and the semiconductor substrate, wherein the gate pad is formed by
a first pad portion having a first part of the first surface area, where wiring is bonded and
a second pad portion having a second part of the first surface area, connected to the gate resistance, and being continuous with the first pad portion, the gate polysilicon layer is formed by
a first polysilicon portion having a first part of the second surface area equal to or greater than the first part of the first surface area, and facing the first pad portion in the depth direction via the interlayer insulating film, the first pad portion being disposed within the first polysilicon portion in the plan view, and
a second polysilicon portion having a second part of the second surface area equal to or greater than the second part of the first surface area, and facing the second pad portion in the depth direction via the interlayer insulating film, the second pad portion being disposed within the second polysilicon portion in the plan view, the second polysilicon portion forming the gate resistance and being electrically connected between the second pad portion and the gate electrode, and being continuous with the first polysilicon portion, an ESD capability of a first region in which the gate pad is provided is greater than an ESD capability of a second region in which the gate resistance is provided, and an ESD capability of a third region in which the MOS structure is provided, the third region being disposed within the active region, and the oxide film sandwiched between the gate polysilicon layer and the semiconductor substrate and being disposed in the first region and the gate insulating film of the MOS transistor are made of a common layer.

2. The semiconductor device according to claim 1, wherein the ESD capability of the third region in which the MOS structure is provided is greater than the ESD capability of the second region in which the gate resistance is provided.

3. The semiconductor device according to claim 1, wherein a capacitance of the first region in which the gate pad is provided is greater than a capacitance of the second region in which the gate resistance is provided and a capacitance of the third region in which the MOS structure is provided.

4. The semiconductor device according to claim 1, wherein a capacitance of the third region in which the MOS structure is provided is greater than a capacitance of the second region in which the gate resistance is provided.

5. The semiconductor device according to claim 1, wherein the interlayer insulating film sandwiched between the gate pad and the gate polysilicon layer, or the oxide film sandwiched between the gate polysilicon layer and the semiconductor substrate has a thickness greater than a thickness of the gate insulating film of the third region in which the MOS structure is provided.

6. The semiconductor device according to claim 1, wherein the oxide film sandwiched between the gate polysilicon layer and the semiconductor substrate in the second region in which the gate resistance is provided having a thickness greater than a thickness of the gate insulating film of the MOS transistor.

7. The semiconductor device according to claim 1, wherein the interlayer insulating film sandwiched between the gate pad and the gate polysilicon layer, or the oxide film sandwiched between the gate polysilicon layer and the semiconductor substrate has a permittivity lower than a permittivity of the gate insulating film of the MOS transistor.

8. The semiconductor device according to claim 1, wherein the oxide film sandwiched between the gate polysilicon layer and the semiconductor substrate in the second region in which the gate resistance is provided has a permittivity lower than a permittivity of the gate insulating film of the MOS transistor.

9. The semiconductor device according to claim 1, wherein
the interlayer insulating film sandwiched between the gate pad and the gate polysilicon layer is an oxide film containing phosphorus, and
the gate insulating film is an oxide film containing nitrogen.

10. The semiconductor device according to claim 1, wherein
the third region has a third surface area in the plan view, and
the second part of the second surface area is smaller than the first surface area or the third surface area.

11. The semiconductor device according to claim 1, wherein
the MOS structure of the active region includes
a trench gate structure formed by:
in a first conductivity type surface layer of the first main surface of the semiconductor substrate, a first semiconductor region of a second conductivity type;
a second semiconductor region of the first conductivity type, selectively provided in the first semiconductor region;
a third semiconductor region of the first conductivity type, the third semiconductor region being a portion of the semiconductor substrate excluding the first semiconductor region;
a trench penetrating the second semiconductor region and the first semiconductor region, and reaching the third semiconductor region; and
the gate electrode provided in the trench via the gate insulating film,
a first electrode electrically connected to the first semiconductor region and the second semiconductor region, and
a second electrode electrically connected to the second main surface of the semiconductor substrate, and
the gate polysilicon layer is electrically connected to the gate electrode or the first electrode.

12. A semiconductor device having an active region in which a Metal-Oxide-Semiconductor (MOS) structure including a MOS transistor is configured, and in which current flows during an ON state of the MOS transistor, the semiconductor device, comprising:
a semiconductor substrate having a first main surface and a second main surface opposite to the first main surface;
a gate electrode provided on the semiconductor substrate via a gate insulating film, the gate electrode and the gate insulating film constituting a part of the MOS transistor;
an interlayer insulating film provided on the first main surface of the semiconductor substrate;
an oxide film provided on the first main surface of the semiconductor substrate;
a gate pad having a first surface area in a plan view, and being provided on the first main surface of the semiconductor substrate via the interlayer insulating film, the interlayer insulating film being provided between the semiconductor substrate and the gate pad; and
a gate polysilicon layer including a gate resistance, and having a second surface area in the plan view, the gate polysilicon layer facing the gate pad in a depth direction, via the interlayer insulating film, and being electrically insulated from the semiconductor substrate by the oxide film, the oxide film being disposed between the semiconductor substrate and the gate polysilicon layer, wherein
the gate pad is formed by
a first pad portion having a first part of the first surface area, where wiring is bonded and
a second pad portion having a second part of the first surface area, connected to the gate resistance, and being continuous with the first pad portion,
the gate polysilicon layer is formed by
a first polysilicon portion having a first part of the second surface area equal to or greater than the first part of the first surface area, and facing the first pad portion in the depth direction via the interlayer insulating film, the first pad portion being disposed within the first polysilicon portion in the plan view, and
a second polysilicon portion having a second part of the second surface area equal to or greater than the second part of the first surface area, and facing the second pad portion in the depth direction via the interlayer insulating film, the second pad portion being disposed within the second polysilicon portion in the plan view, the second polysilicon portion forming the gate resistance and being electrically connected between the second pad portion and the gate electrode, and being continuous with the first polysilicon portion,
an ESD capability of a first region in which the gate pad is provided is greater than an ESD capability of a second region in which the gate resistance is provided, and an ESD capability of a third region in which the MOS structure is provided, the third region being disposed within the active region, the interlayer insulating film sandwiched between the gate pad and the gate polysilicon layer is an oxide film containing phosphorus, and the gate insulating film is an oxide film containing nitrogen.

13. A semiconductor device having an active region in which a Metal-Oxide-Semiconductor (MOS) structure including a MOS transistor is configured, and in which current flows during an ON state of the MOS transistor, the semiconductor device, comprising:

a semiconductor substrate having a first main surface and a second main surface opposite to the first main surface;

a gate electrode provided on the semiconductor substrate via a gate insulating film, the gate electrode and the gate insulating film constituting a part of the MOS transistor;

an interlayer insulating film provided on the first main surface of the semiconductor substrate;

an oxide film provided on the first main surface of the semiconductor substrate;

a gate pad having a first surface area in a plan view, and being provided on the first main surface of the semiconductor substrate via the interlayer insulating film, the interlayer insulating film being provided between the semiconductor substrate and the gate pad; and a gate polysilicon layer including a gate resistance, and having a second surface area in the plan view, the gate polysilicon layer facing the gate pad in a depth direction, via the interlayer insulating film, and being electrically insulated from the semiconductor substrate by the oxide film, the oxide film being disposed between the semiconductor substrate and the gate polysilicon layer, wherein the gate pad is formed by a first pad portion having a first part of the first surface area, where wiring is bonded and a second pad portion having a second part of the first surface area, connected to the gate resistance, and being continuous with the first pad portion, the gate polysilicon layer is formed by a first polysilicon portion having a first part of the second surface area equal to or greater than the first part of the first surface area, and facing the first pad portion in the depth direction via the interlayer insulating film, the first pad portion being disposed within the first polysilicon portion in the plan view, and a second polysilicon portion having a second part of the second surface area equal to or greater than the second part of the first surface area, and facing the second pad portion in the depth direction via the interlayer insulating film, the second pad portion being disposed within the second polysilicon portion in the plan view, the second polysilicon portion forming the gate resistance and being electrically connected between the second pad portion and the gate electrode, and being continuous with the first polysilicon portion, an ESD capability of a first region in which the gate pad is provided is greater than an ESD capability of a second region in which the gate resistance is provided, and an ESD capability of a third region in which the MOS structure is provided, the third region being disposed within the active region, the third region has a third surface area in the plan view, and the second part of the second surface area is smaller than the first surface area or the third surface area.

14. The semiconductor device according to claim 13, wherein the ESD capability of the third region in which the MOS structure is provided is greater than the ESD capability of the second region in which the gate resistance is provided.

15. The semiconductor device according to claim 13, wherein a capacitance of the first region in which the gate pad is provided is greater than a capacitance of the second region in which the gate resistance is provided and a capacitance of the third region in which the MOS structure is provided.

16. The semiconductor device according to claim 13, wherein a capacitance of the third region in which the MOS structure is provided is greater than a capacitance of the second region in which the gate resistance is provided.

17. The semiconductor device according to claim 13, wherein the interlayer insulating film sandwiched between the gate pad and the gate polysilicon layer, or the oxide film sandwiched between the gate polysilicon layer and the semiconductor substrate has a thickness greater than a thickness of the gate insulating film of the third region in which the MOS structure is provided.

18. The semiconductor device according to claim 13, wherein the oxide film sandwiched between the gate polysilicon layer and the semiconductor substrate in the second region in which the gate resistance is provided having a thickness greater than a thickness of the gate insulating film of the MOS transistor.

19. The semiconductor device according to claim 13, wherein the interlayer insulating film sandwiched between the gate pad and the gate polysilicon layer, or the oxide film sandwiched between the gate polysilicon layer and the semiconductor substrate has a permittivity lower than a permittivity of the gate insulating film of the MOS transistor.

20. The semiconductor device according to claim 13, wherein the oxide film sandwiched between the gate polysilicon layer and the semiconductor substrate in the second region in which the gate resistance is provided has a permittivity lower than a permittivity of the gate insulating film of the MOS transistor.

21. The semiconductor device according to claim 13, wherein the oxide film sandwiched between the gate polysilicon layer and the semiconductor substrate and being disposed in the first region and the gate insulating film of the MOS transistor are made of a common layer, the semiconductor device further comprising a thin deposited film of oxide, provided between the oxide film and the semiconductor substrate.

22. The semiconductor device according to claim 13, wherein the interlayer insulating film sandwiched between the gate pad and the gate polysilicon layer is an oxide film containing phosphorus, and the gate insulating film is an oxide film containing nitrogen.

23. The semiconductor device according to claim 13, wherein the MOS structure of the active region includes a trench gate structure formed by:

in a first conductivity type surface layer of the first main surface of the semiconductor substrate, a first semiconductor region of a second conductivity type;

a second semiconductor region of the first conductivity type, selectively provided in the first semiconductor region;
a third semiconductor region of the first conductivity type, the third semiconductor region being a portion of the semiconductor substrate excluding the first semiconductor region;
a trench penetrating the second semiconductor region and the first semiconductor region, and reaching the third semiconductor region; and
the gate electrode provided in the trench via the gate insulating film,
a first electrode electrically connected to the first semiconductor region and the second semiconductor region, and
a second electrode electrically connected to the second main surface of the semiconductor substrate, and
the gate polysilicon layer is electrically connected to the gate electrode or the first electrode.

* * * * *